United States Patent
Johnson

(10) Patent No.: US 7,548,742 B2
(45) Date of Patent: *Jun. 16, 2009

(54) TUNER FOR RADIO FREQUENCY RECEIVERS AND ASSOCIATED METHOD

(75) Inventor: Richard A. Johnson, Buda, TX (US)

(73) Assignee: Silicon Laboratories, Inc., Austin, TX (US)

( * ) Notice: Subject to any disclaimer, the term of this patent is extended or adjusted under 35 U.S.C. 154(b) by 844 days.

This patent is subject to a terminal disclaimer.

(21) Appl. No.: 10/784,838

(22) Filed: Feb. 23, 2004

(65) Prior Publication Data

US 2004/0176058 A1   Sep. 9, 2004

Related U.S. Application Data

(63) Continuation-in-part of application No. 10/375,967, filed on Feb. 28, 2003, now Pat. No. 6,778,117, and a continuation-in-part of application No. 10/377,573, filed on Feb. 28, 2003, now Pat. No. 7,447,493.

(51) Int. Cl.
  *H04B 1/26*   (2006.01)
  *H03M 1/00*   (2006.01)

(52) U.S. Cl. .................. 455/313; 455/323; 455/260; 455/258; 341/126

(58) Field of Classification Search ......... 455/313–334, 455/552.1, 3.02, 258–265, 182.2, 186.1; 327/356–359; 341/126, 144, 110
See application file for complete search history.

(56) References Cited

U.S. PATENT DOCUMENTS

| | | | |
|---|---|---|---|
| 4,346,477 A | 8/1982 | Gordy | |
| 4,361,906 A * | 11/1982 | Sakamoto | 455/182.2 |
| 4,464,770 A | 8/1984 | Maurer et al. | |
| 4,626,803 A | 12/1986 | Holm | |
| 4,653,117 A | 3/1987 | Heck | |
| 4,803,700 A | 2/1989 | Dewey et al. | |
| 4,817,167 A | 3/1989 | Gassmann | |

(Continued)

FOREIGN PATENT DOCUMENTS

WO   WO 87/01531   3/1987

OTHER PUBLICATIONS

Kim, Beomsup; Conroy, Cormac, A low power CMOS Bluetooth transceiver with a Digital Offset Cancelling DLL-based GFSK Demodulator, Feb. 9-13, 2003, Proceedings of IEEE International Solid State Circuits Conference, IEEE, vol. 1, pp. 96-481.*

(Continued)

*Primary Examiner*—Lana N Le
(74) *Attorney, Agent, or Firm*—Larson Newman Abel & Polansky, LLP

(57) ABSTRACT

A tuner architecture is disclosed that mixes an analog RF input signal and a digital local oscillator signal to generate a output signal at a desired IF frequency, including low-IF and zero-IF solutions. The tuner provides a number of advantages over previous implementations, such as improved performance for low-IF and zero-IF architectures and a significant reduction in interference between adjacent paths in a multiple tuner solution. Other features and variations can be implemented, if desired, and related methods can be utilized, as well.

46 Claims, 10 Drawing Sheets

U.S. PATENT DOCUMENTS

| | | | |
|---|---|---|---|
| 4,866,261 A | 9/1989 | Pace | |
| 4,926,130 A | 5/1990 | Weaver | |
| 4,944,025 A | 7/1990 | Gehring | |
| 4,975,699 A | 12/1990 | Frey | |
| 5,251,218 A * | 10/1993 | Stone et al. | 455/324 |
| 5,263,194 A | 11/1993 | Ragan | |
| 5,440,587 A | 8/1995 | Ishikawa et al. | |
| 5,442,352 A | 8/1995 | Jackson | 341/136 |
| 5,495,512 A | 2/1996 | Kovacs et al. | |
| 5,544,200 A | 8/1996 | An | |
| 5,640,698 A | 6/1997 | Shen et al. | |
| 5,737,035 A | 4/1998 | Rotzoll | 348/725 |
| 5,826,180 A | 10/1998 | Golan | |
| 5,828,955 A | 10/1998 | Lipowski et al. | |
| 5,867,535 A | 2/1999 | Phillips et al. | |
| 6,154,640 A | 11/2000 | Itoh et al. | |
| 6,172,569 B1 | 1/2001 | McCall et al. | |
| 6,177,964 B1 | 1/2001 | Birleson et al. | 348/725 |
| 6,222,891 B1 * | 4/2001 | Liu et al. | 375/326 |
| 6,249,179 B1 | 6/2001 | Maalej et al. | |
| 6,263,195 B1 | 7/2001 | Niu et al. | |
| 6,278,391 B1 | 8/2001 | Walker | |
| 6,321,075 B1 * | 11/2001 | Butterfield | 455/313 |
| 6,330,290 B1 | 12/2001 | Glas | |
| 6,377,315 B1 | 4/2002 | Carr et al. | 348/726 |
| 6,593,805 B2 | 7/2003 | Kunieda et al. | |
| 6,600,373 B1 | 7/2003 | Bailey et al. | |
| 6,639,534 B2 | 10/2003 | Khoini-Poorfard et al. | |
| 6,711,149 B1 * | 3/2004 | Yano et al. | 455/437 |
| 6,778,117 B1 | 8/2004 | Johnson | |
| 6,785,345 B2 * | 8/2004 | Blazo | 327/106 |
| 6,785,529 B2 | 8/2004 | Ciccarelli et al. | |
| 6,799,020 B1 * | 9/2004 | Heidmann et al. | 455/103 |
| 6,829,311 B1 | 12/2004 | Riley | |
| 6,867,693 B1 | 3/2005 | Radin | |
| 6,950,047 B1 | 9/2005 | Piasecki et al. | |
| 6,963,734 B2 | 11/2005 | Sorrells et al. | |
| 7,035,595 B1 * | 4/2006 | Kim et al. | 455/73 |
| 7,139,329 B2 * | 11/2006 | Takahiko | 375/316 |
| 7,183,958 B2 | 2/2007 | Quilligan et al. | |
| 7,199,740 B1 | 4/2007 | Ferguson et al. | |
| 7,227,438 B2 | 6/2007 | Song et al. | |
| 2001/0041532 A1 * | 11/2001 | Tomasz et al. | 455/3.02 |
| 2002/0168951 A1 * | 11/2002 | Paulus et al. | 455/130 |
| 2002/0177423 A1 * | 11/2002 | Cowley | 455/258 |
| 2003/0083033 A1 * | 5/2003 | Staszewski et al. | 455/313 |
| 2003/0112893 A1 | 6/2003 | Lee et al. | |
| 2003/0199264 A1 * | 10/2003 | Holenstein et al. | 455/324 |
| 2003/0223525 A1 | 12/2003 | Momtaz et al. | |
| 2004/0169773 A1 | 9/2004 | Johnson | |
| 2005/0117071 A1 | 6/2005 | Johnson | |
| 2005/0239499 A1 * | 10/2005 | Oosawa et al. | 455/552.1 |
| 2005/0266818 A1 | 12/2005 | Johnson et al. | |
| 2006/0073800 A1 | 4/2006 | Johnson et al. | |
| 2006/0083320 A1 | 4/2006 | Feher | |
| 2006/0141973 A1 * | 6/2006 | Behrens et al. | 455/313 |
| 2007/0085719 A1 | 4/2007 | Maxim et al. | |
| 2008/0181337 A1 * | 7/2008 | Maxim | 455/130 |

OTHER PUBLICATIONS

Kim, Beomsup; Conroy, Cormac, RF Transceivers for Wireless in Standard CMOS, Jan. 17-19, 2006, 2006 IEEE Radio and Wireless Symposium, IEEE, pp. 7-10.*

Kim, Beomsup; Conroy, Cormac, A Single Chip Quad-band GSM/GPRS Transceiver in .18um Standard CMOS, 2005 IEEE International Solid State Circuit Conference, vol. 1, pp. 318-601.*

"A GSM/GPRS Mixed Signal Baseband IC," Redmond, David. et al., IEEE Int'l. Solid State Circuits Conference (ISSCC), Digest of Technical Papers, XP010585465, Feb. 2010, Sec. 3.6.

"Optimized Digital Signal Processing for Flexible Receivers," Brückmann, Dieter et al., IEEE Int'l (ICASSP), XP010804418, 2002, pp. IV—3765-3766.

[[Actions on the Merits by the U.S.P.T.O. as of Nov. 7, 2007, 2 pages.]].

* cited by examiner

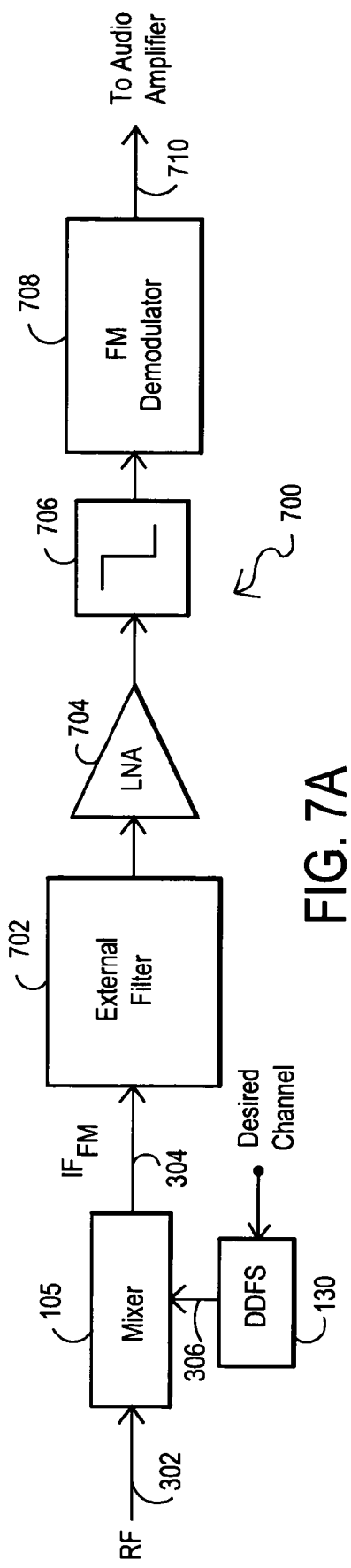
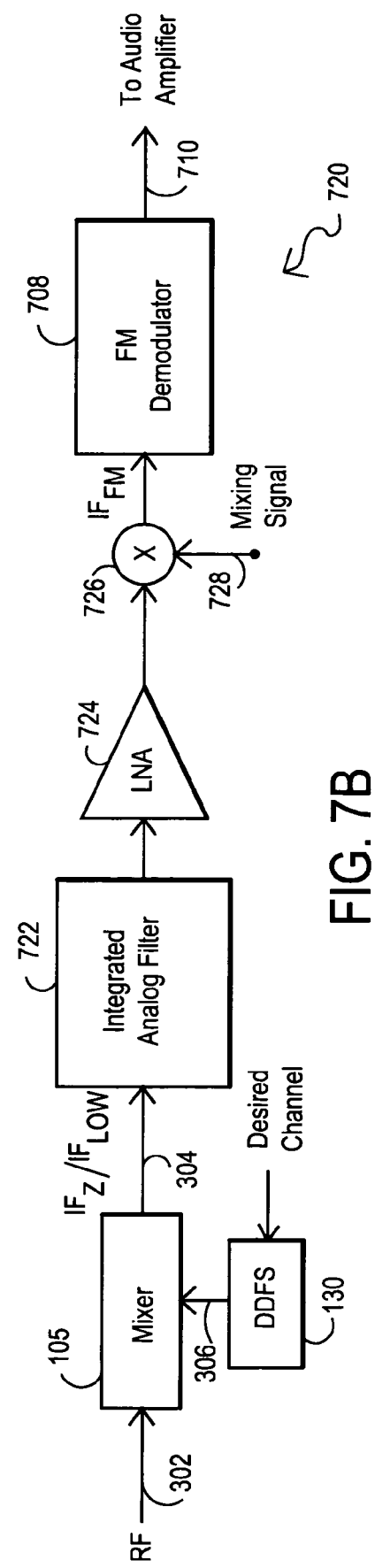
FIG. 7A
FIG. 7B

TUNER FOR RADIO FREQUENCY RECEIVERS AND ASSOCIATED METHOD

RELATED APPLICATIONS

This application is a continuation-in-part application of the following applications: application Ser. No. 10/375,967 that is entitled "Local Oscillator and Mixer for Radio Frequency Receiver and Related Method," which was filed on Feb. 28, 2003 now U.S. Pat. No. 6,778,117; and application Ser. No. 10/377,573 that is entitled "Tuner Suitable for Integration and Method For Tuning a Radio Frequency Signal," which was filed Feb. 28, 2003 now U.S. Pat. No. 7,447,493, the entire text and all contents for both of which are hereby expressly incorporated by reference in their entirety.

TECHNICAL FIELD OF THE INVENTION

The present invention relates generally to radio frequency signal receivers, and more particularly to mixers and related circuits for use in radio frequency receivers.

BACKGROUND

Radio frequency (RF) receivers are used in a wide variety of applications such as television, cellular telephones, pagers, global positioning system (GPS) receivers, cable modems, cordless phones, radios and other devices that receive RF signals. RF receivers all require frequency translation or mixing. For example, a television receiver may translate one channel in the band of 48 MHz to 870 MHz to an intermediate frequency of 44 MHz. And within the United States, FM radios will typically translate FM audio signals, which are broadcast in 200 KHz channels in the frequency band from 88.1 MHz to 107.9 MHz, to an intermediate frequency of 10.7 MHz.

The majority of today's RF receivers perform the necessary frequency translation or mixing using an oscillator and analog multiplier. FIG. 1 illustrates in schematic form a local oscillator and mixer circuit 60 known in the prior art that uses this technique. Circuit 60 includes an oscillator 62 and a mixer 64. Oscillator 62 forms local oscillator signal labeled "LO" in the form of a sine wave having a frequency of $f_{LO}$. Mixer 64 mixes the RF input signal having desired spectral content at $f_{IN}$ with the local oscillator signal to form an output voltage signal labeled "$V_{OUT}$" having spectral content at frequencies equal to the sum and difference of the input frequencies, namely $f_{IN}+f_{LO}$ and $f_{IN}-f_{LO}$.

Mathematically, the RF input signal can be expressed as:

$$RF = A_{IN}(\cos \omega_{IN} t) \quad [1]$$

where $A_{IN}$ is the amplitude of the RF input signal, and $\omega_{IN}$ is the radian frequency. Similarly the local oscillator signal can be expressed as:

$$LO = A_{LO}(\cos \omega_{LO} t) \quad [2]$$

where $A_{LO}$ is the amplitude of the local oscillator signal, and $\omega_{LO}$ is the radian frequency. The product formed at the output of the mixer can be expressed as:

$$V_{OUT} = [A_{IN}(\cos \omega_{IN} t)][A_{LO}(\cos \omega_{LO} t)] \quad [3]$$

$$= \frac{A_{IN} A_{LO}}{2}[\cos(\omega_{IN} - \omega_{LO})t + \cos(\omega_{IN} + \omega_{LO})t]$$

One of these components forms the channel spectrum translated to the desired frequency and the other component can be filtered out. Oscillator 62 can be implemented, for example, by a tuned inductor-capacitor (LC) oscillator, a charge relaxation oscillator, or a ring oscillator.

An alternative is shown in FIG. 2, which illustrates in partial block diagram and partial schematic form another local oscillator and mixer circuit 80 known in the prior art. In circuit 80 a digitally synthesized oscillator 82, also known as a direct digital frequency synthesizer (DDFS), is used to generate the LO signal. The output of DDFS 82 is converted into an analog signal using a digital-to-analog converter (DAC) 84 for input to a mixer 86. This technique of generating the local oscillator signal has several advantages compared to the analog oscillator used in FIG. 1, including wide tuning range, high noise immunity, minimal self-mixing, and minimal leakage. However, the Nyquist criterion that forces DDFS 82 to be clocked at greater than twice the highest oscillation frequency has so far limited its use to low-frequency applications.

It would be desirable to have circuitry for use in an RF receiver that is suitable for higher frequency applications. Such circuitry and related methods are provided by the present invention, whose features and characteristics will become apparent from the subsequent detailed description of the invention and the appended claims, taken in conjunction with the accompanying drawings and this background of the invention.

SUMMARY OF THE INVENTION

The present invention is a unique tuner architecture that mixes an analog RF input signal and a digital local oscillator signal to generate a output signal at a desired IF frequency, including low-IF and zero-IF solutions. The unique tuner of the present invention has a number of advantages over previous implementations, such as improved performance for low-IF and zero-IF architectures and a significant reduction in interference between adjacent paths in a multiple tuner solution.

In part, the present invention is a tuner including a direct digital frequency synthesizer having an output terminal for providing a digital local oscillator signal having a frequency chosen to mix a channel to a desired frequency and including a mixer having a first input terminal for receiving a radio frequency signal, a second input terminal coupled to the output terminal of the direct digital frequency synthesizer, and an output terminal for providing an output signal at a desired frequency. In addition, the direct digital frequency synthesizer and the mixer can be combined in a single integrated circuit. And the mixer can include a transconductance amplifier having an input terminal for receiving the radio frequency signal and an output terminal for providing at least one current signal and a mixing digital-to-analog converter having a first input terminal coupled to the output terminal of the transconductance amplifier, a second input terminal coupled to the output terminal of the direct digital frequency synthesizer, and an output terminal for providing the output signal at the desired frequency. Still further, the transconductance amplifier can be made up of a plurality of current cells, and these current cells can be characterized as being binarily weighted. The tuner may also include at least one additional receive path on the single integrated circuit. And the one or more integrated tuners can received a variety of RF signal bands, including terrestrial television broadcasts and FM radio broadcasts. As described below, other features and variations can be implemented, if desired, and related methods can be utilized, as well.

In another embodiment, the present invention is a method for tuning a signal comprising the steps of generating a digital local oscillator signal having a frequency chosen to mix a channel to a desired frequency, receiving a radio frequency signal and mixing the radio frequency signal with the digital local oscillator signal to provide an output signal at the desired frequency. More particularly, the generating and mixing steps can be performed within a single integrated circuit. And the mixing step can include converting the radio frequency signal to at least one current signal and mixing the at least one current signal with the output from the direct digital frequency synthesizer. Still further, the converting step can include generating a plurality of current signals using a plurality of transconductor cells. Still further, additional tuning paths can be provide, and a variety of RF signal bands can be tuned, including terrestrial television broadcasts and FM radio broadcasts. As described below, other features and variations can be implemented, if desired, and related systems can be utilized, as well.

DESCRIPTION OF THE DRAWINGS

It is noted that the appended drawings illustrate only exemplary embodiments of the invention and are, therefore, not to be considered limiting of its scope, for the invention may admit to other equally effective embodiments.

FIG. 7A is a block diagram for an integrated FM radio receiver implementation utilizing the tuner of the present invention and an external filter.

FIG. 7B is a block diagram for a low-IF or zero-IF integrated FM radio receiver implementation utilizing the tuner of the present invention and an integrated analog filter.

DETAILED DESCRIPTION OF THE INVENTION

The present invention provides a unique tuner architecture that mixes an analog RF input signal and a digital local oscillator signal to generate a output signal at a desired IF frequency, including low-IF and zero-IF solutions. The unique tuner of the present invention has a number of advantages over previous implementations, which will be described in more detail below.

Figure 3:
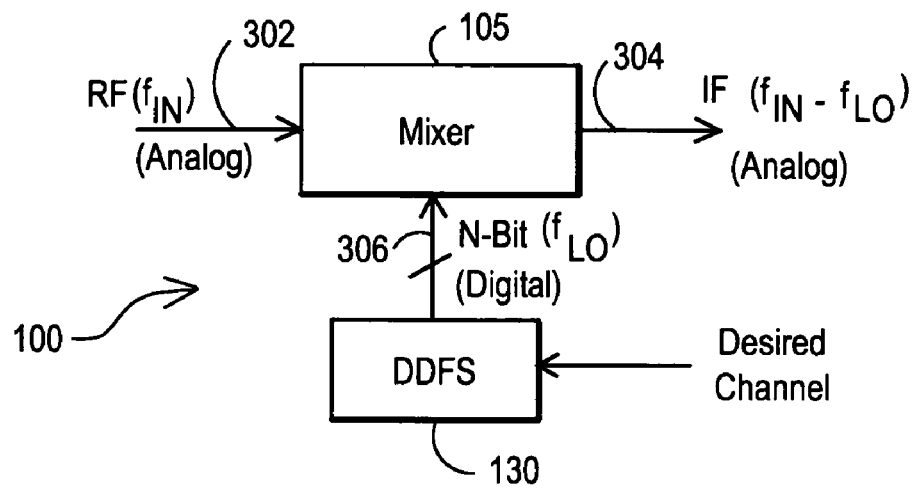
FIG. 3 is a block diagram for a tuner for a radio frequency receiver according to the present invention.
Figure 4A:
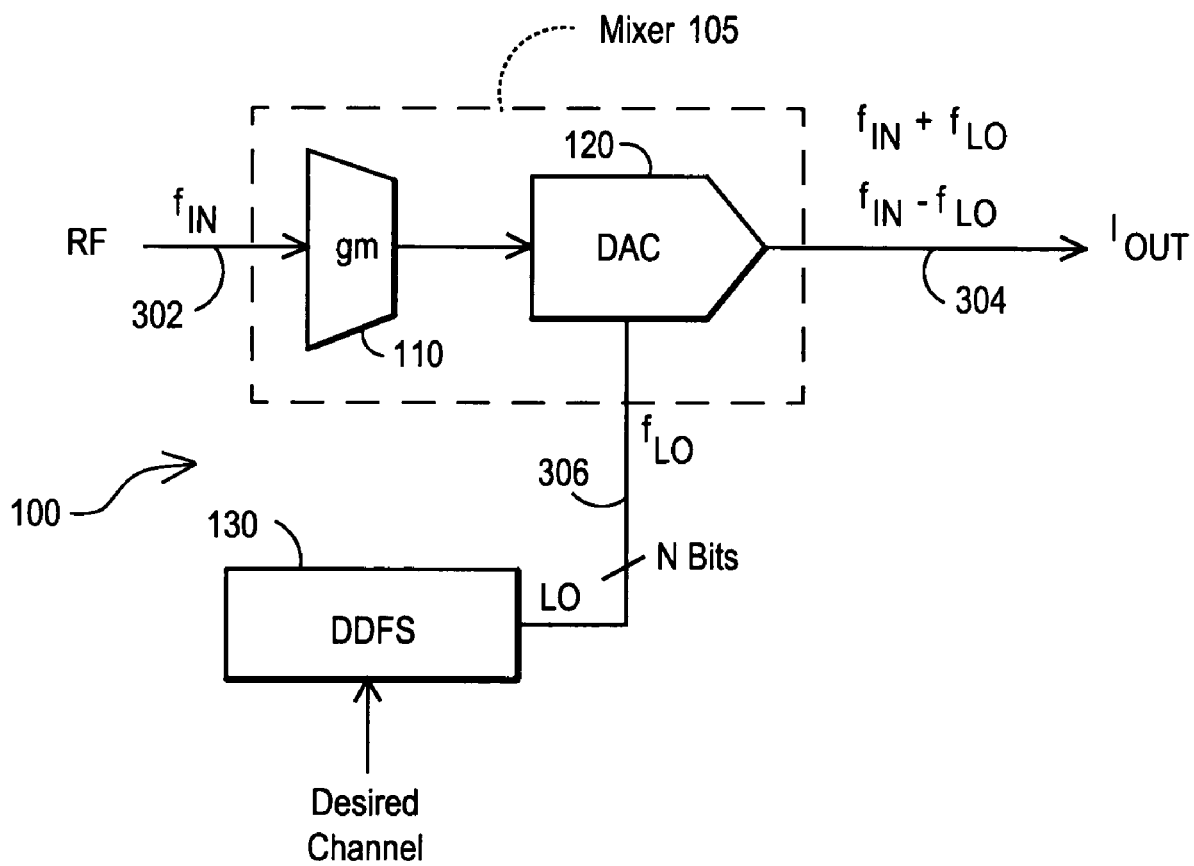
FIG. 4A illustrates in partial block diagram and partial schematic form one embodiment of a local oscillator and mixer circuit for a tuner according to the present invention.
Figure 4B:
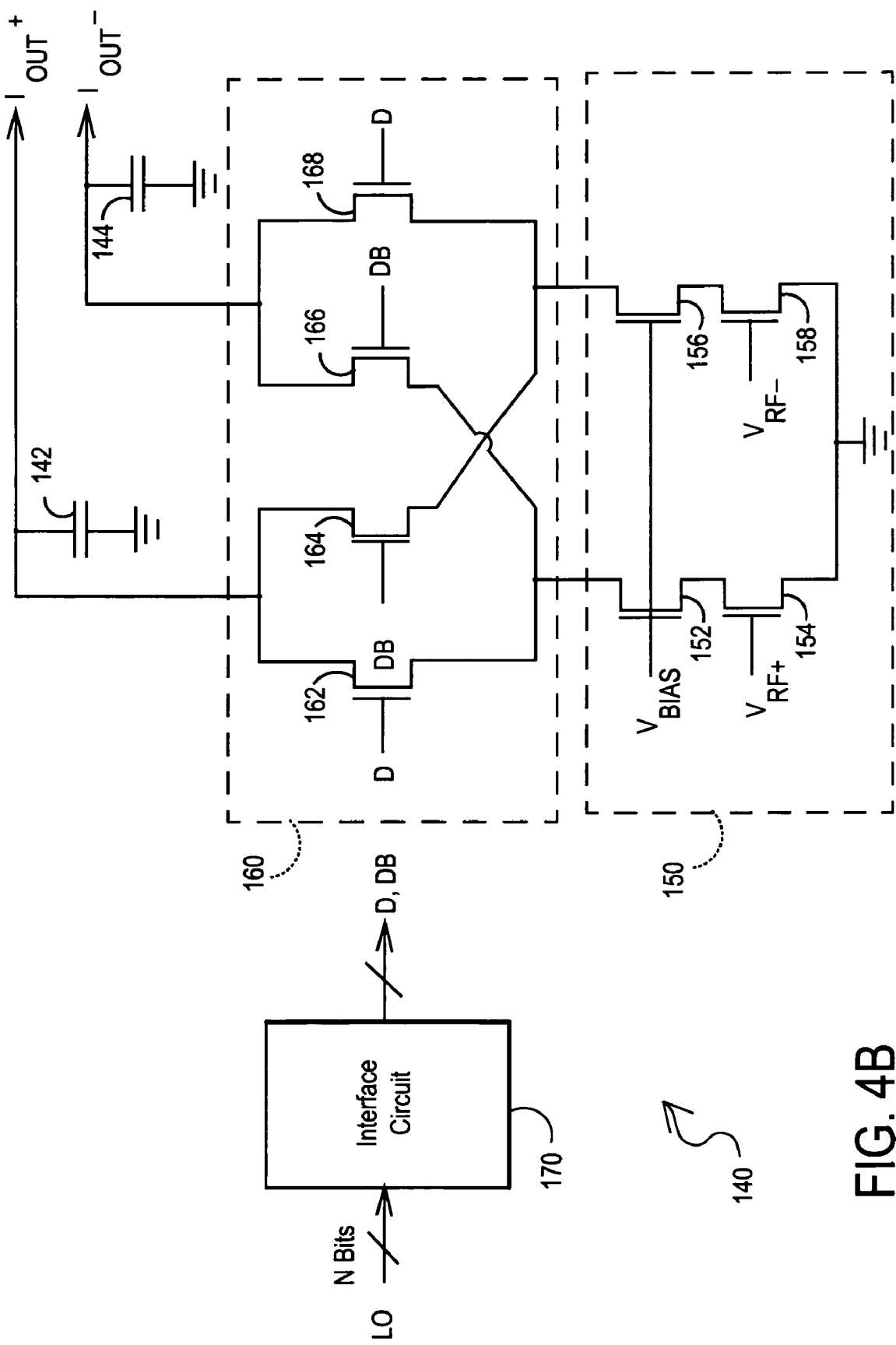
FIG. 4B illustrates in schematic form a circuit implementation of one cell of the mixer circuit of FIG. 4A.
Figure 5:
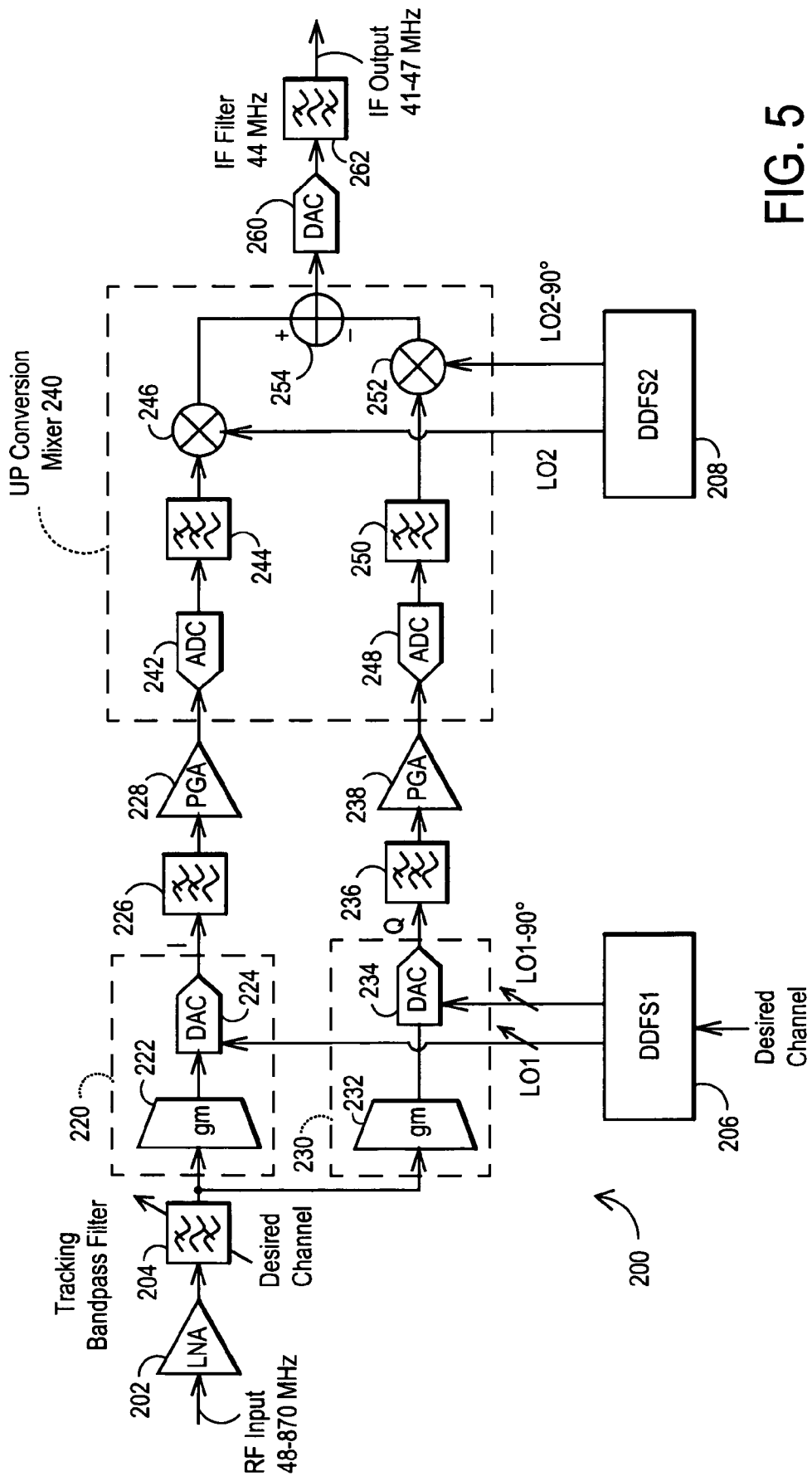
FIG. 5 illustrates in partial block diagram and partial schematic form an integrated television tuner that advantageously uses the circuitry of FIGS. 4A and 4B.
Figure 6A:
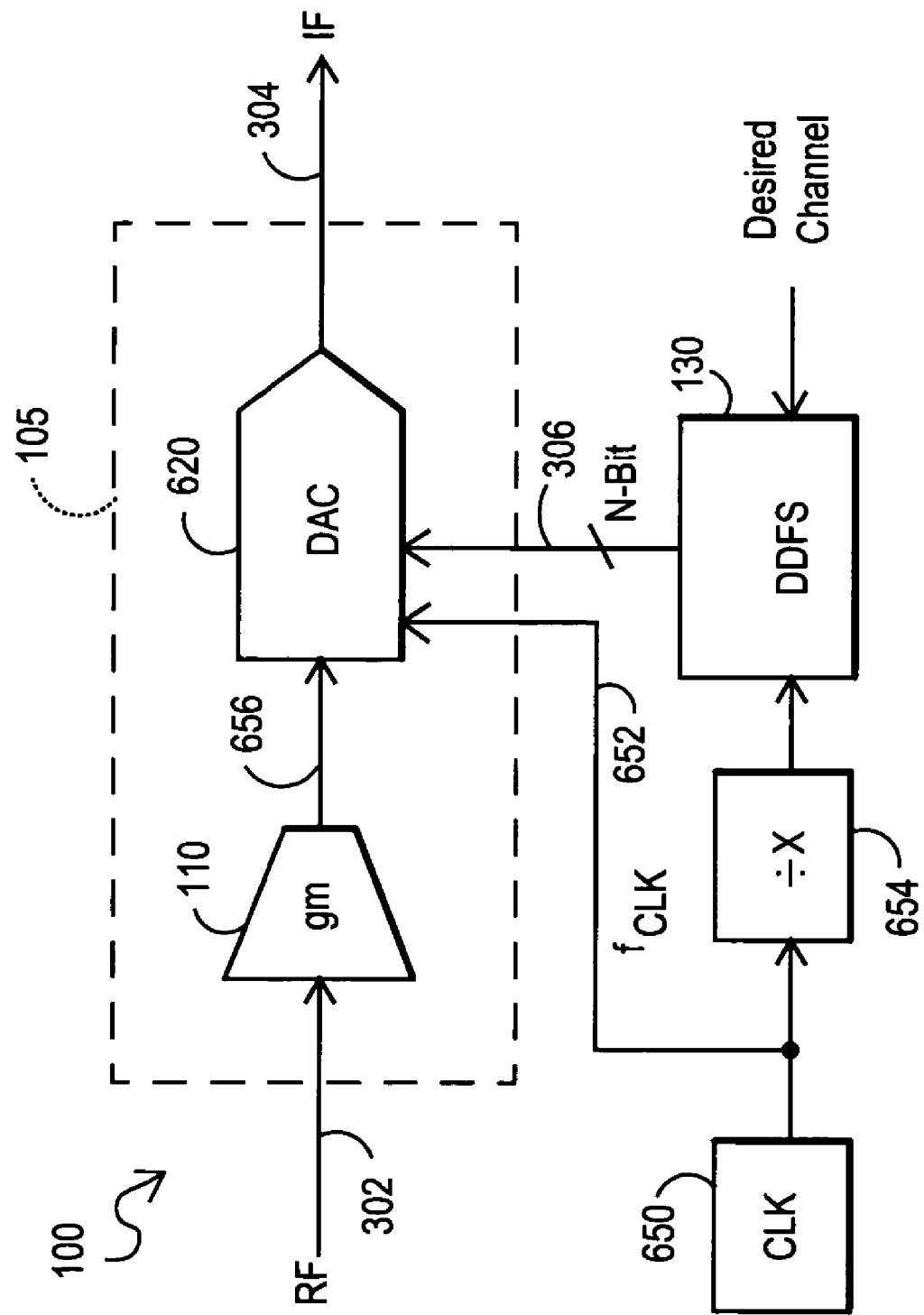
FIG. 6A is a block diagram of an alternative embodiment for a local oscillator and mixer circuit for a tuner according to the present invention.
Figure 6B:
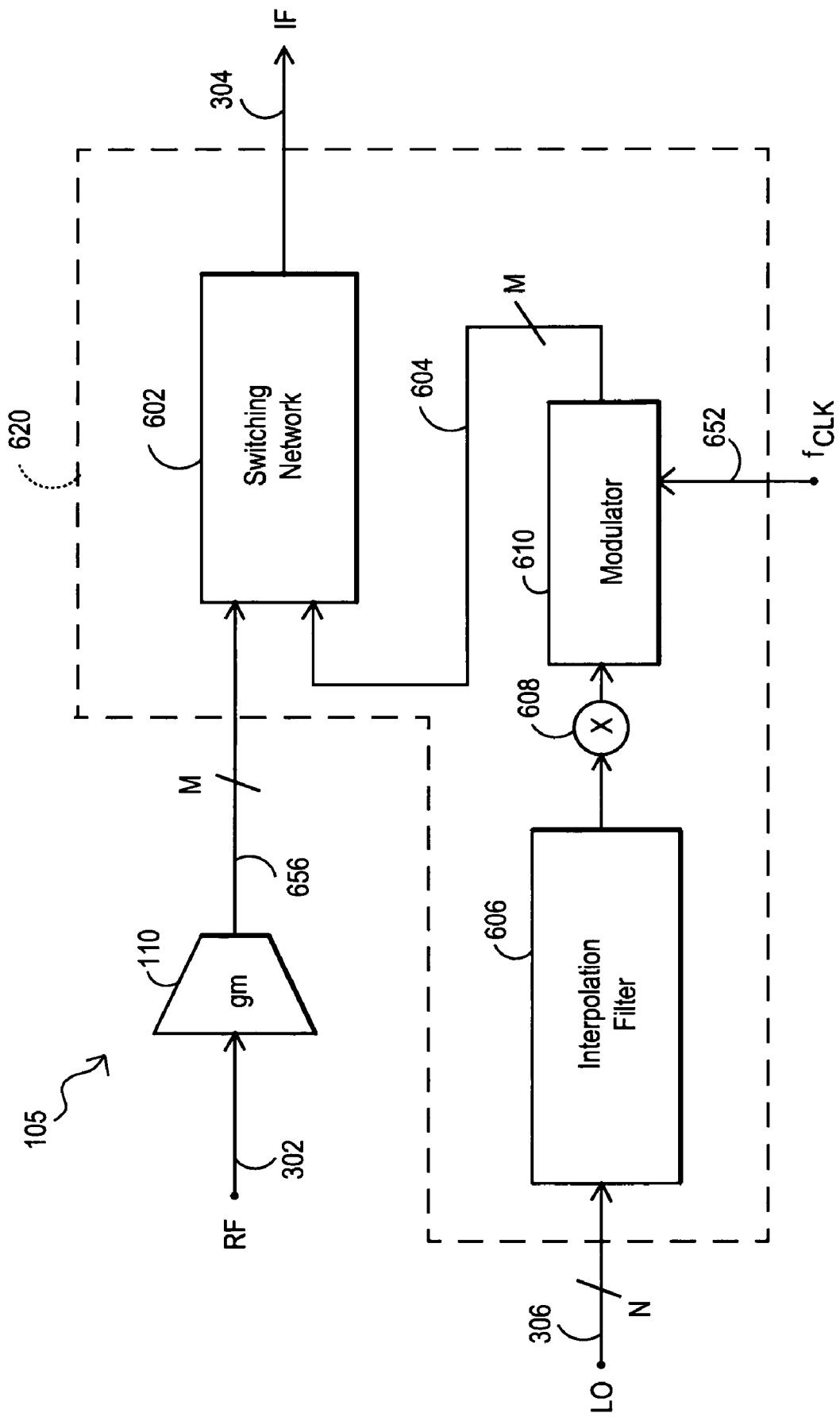
FIG. 6B is a block diagram for one implementation of the mixer in FIG. 6A.

In the discussion below, FIG. 3 provides a general block diagram for a tuner 100 according to the present invention that utilizes a mixer circuit 105 to mix an analog RF input signal and a digital LO signal 306 to generate an analog IF output signal 304 at a desired IF frequency. FIGS. 4A and 4B provide an example embodiment for a tuner 100 and mixer circuit 105, and FIGS. 6A and 6B provide another example embodiment for tuner 100 and mixer circuit 105, respectively. Each embodiment utilizes a mixer circuit 105 that receives an analog RF input signal 302 and a digital LO signal 306 from a DDFS 130 to generate an output analog signal 304 that can be further processed as desired. FIG. 5 provides an example television receiver that takes advantage of the embodiments of FIGS. 4A and 4B. FIGS. 7A-C and FIGS. 8A-B provide example FM receivers and multi-tuner implementations that take advantage of the embodiments of FIGS. 6A and 6B. In the discussion below, the embodiments of FIGS. 4A and 4B is first discussed, followed by a discussion of the embodiments of FIGS. 6A and 6B. Next, the television tuner implementation example of FIG. 5 is discussed, followed by the FM tuner implementation examples of FIGS. 7A-7C and FIGS. 8A-B. It is noted that other variations and implementations utilizing the tuner of the present invention can be utilized, as well.

FIG. 3 is a block diagram for a tuner 100 for a radio frequency (RF) receiver according to the present invention. As depicted, a mixer circuit 105 receives an analog RF input signal ($f_{IN}$) 302 and an N-bit digital local oscillator (LO) signal ($f_{LO}$) 306. The mixer circuit 105 mixes these two signals together to produce an analog output signal 304 that represents a multiplication of the two input frequencies ($f_{IN} \cdot f_{LO}$) and may be at any desired intermediate frequency (IF), including a low-IF frequency or a zero-IF frequency, as discussed in more detail below. Also as depicted, the digital LO signal 306 is generated by a direct digital frequency synthesizer (DDFS) 130. The DDFS 130 produces a multiple-bit (N-bit) digital LO signal 306 that is a digital representation of a sine wave mixing signal. This digital LO signal 306 can also be adjusted depending upon an input signal representing the DESIRED CHANNEL to be tuned. It is noted that as used herein, a "radio frequency" or RF signal means an electrical signal conveying useful information and having a frequency from about 3 kilohertz (kHz) to thousands of gigahertz (GHz), regardless of the medium through which such signal is conveyed. Thus an RF signal may be transmitted through air, free space, coaxial cable, fiber optic cable, etc.

FIG. 4A illustrates, in partial block diagram and partial schematic form, a tuner 100 according to the present invention. Tuner 100 includes a transconductance amplifier 110, a current multiplying DAC 120, and a DDFS 130. Transconductance amplifier 110 has an input terminal for receiving a radio frequency signal 302 labeled "RF", and an output terminal for providing a current signal 304, and has an associated transconductance labeled "gm". Signal RF 302 has desired spectral content centered at a frequency $f_{IN}$. Current multiplying DAC 120 has a first input terminal connected to the output terminal of transconductance amplifier 110, a second input terminal, and an output terminal for providing an output signal labeled "$I_{OUT}$". DDFS 130 has an input terminal for receiving a tuning signal corresponding to a DESIRED CHANNEL, and an output terminal connected to the second input terminal of current multiplying DAC 120 for providing a digital local oscillator signal 306 labeled "LO" and represented by N bits. The digital LO signal 306 is a digital representation of voltages of a sine wave having a frequency $f_{LO}$.

In basic operation, transconductance amplifier 110 converts the RF signal from a voltage signal into a current signal. DAC 120 is a current multiplying DAC that receives the current signal at the output of transconductance amplifier 110, mixes it bit-by-bit with the N-bit mixing signal from DDFS 130, and sums the output current components to form $I_{OUT}$. As a result of the mixing operation $I_{OUT}$ moves the spectral content of RF to sum and difference frequencies, namely $f_{IN}+f_{LO}$ and $f_{IN}-f_{LO}$. DDFS 130 provides signal LO 306 at a frequency chosen to mix the DESIRED CHANNEL to another frequency of interest, such as baseband or another suitable intermediate frequency (IF). Current multiplying DAC 120 includes multiple mixing cells each weighted according to the order of the cell.

FIG. 4B illustrates in schematic form a circuit implementation of one cell 140 of mixer circuit 105 of FIG. 4A. Cell 140 includes generally a current cell 150 of transconductance amplifier 110 and a converter cell 160 of DAC 120. Also shown in FIG. 4A are an interface circuit 170 of DAC 120, a load capacitor 142, and a load capacitor 144. Current cell 150 includes N-channel metal-oxide-semiconductor (MOS) transistors 152, 154, 156, and 158. Transistor 152 has a drain, a gate for receiving a bias voltage labeled "$V_{BIAS}$", and a source. Transistor 154 has a drain connected to the source of transistor 152, a gate for receiving a signal labeled "$V_{RF+}$", and a source connected to a ground power supply voltage terminal. Transistor 156 has a drain, a gate for receiving bias voltage $V_{BIAS}$, and a source. Transistor 158 has a drain connected to the source of transistor 156, a gate for receiving a signal labeled "$V_{RF-}$", and a source connected to the ground power supply voltage terminal.

Converter cell 160 includes transistors 162, 164, 166, and 168. Transistor 162 has a drain for providing signal $I_{OUT}{}^{+}$, a gate for receiving a true data signal labeled "D", and a source connected to the drain of transistor 152. Transistor 164 has a drain connected to the drain of transistor 162, a gate for receiving a complementary data signal labeled "DB", and a source connected to the drain of transistor 156. Transistor 166 has a drain for providing signal $I_{OUT-}$, a gate for receiving signal DB, and a source connected to the drain of transistor 152. Transistor 168 has a drain connected to the drain of transistor 166, a gate for receiving signal D, and a source connected to the drain of transistor 156.

Interface circuit 170 is shared between all current cells in DAC 120 and has an input terminal for receiving the N-bit LO signal from DDFS 130, and an output terminal for providing a multiple bit output signal labeled "D, DB". D and DB are true and complement digital signals, respectively, of a digital signal pair corresponding to certain values of the N-bit LO signal as will be described further below, and interface circuit provides one pair for each converter cell.

Capacitor 142 has a first terminal connected to the drains of transistors 162 and 164, and a second terminal connected to the ground power supply voltage terminal. Capacitor 144 has a first terminal connected to the drains of transistors 166 and 168, and a second terminal connected to the ground power supply voltage terminal. Capacitors 142 and 144 serve as filter capacitors and are shared between all cells.

The RF input signal is represented as a differential voltage signal between $V_{RF+}$ and $V_{RF-}$. $V_{BIAS}$ is a bias voltage selected to keep transistors 154 and 158 operating in the triode (linear) region of their voltage-current characteristic. Thus as $V_{RF+}$ and $V_{RF-}$ vary, they modulate the voltage at the sources of transistors 152 and 156, forming a differential current signal on the drains of transistors 152 and 156. The bits of the digital local oscillator signal LO cause transistors 162, 164, 166, and 168 to switch the current of current cell 150 from side to side. These currents are switched at the output speed of DDFS 130, $f_{CLOCK}$, which is constrained by Nyquist's theorem to be greater than twice the maximum $f_{LO}$. It is noted that the transistors 154 and 158 could also be operated in the saturation region of their voltage-current characteristics, if desired, and the region of operation for these transistors 154 and 158 could be dynamically selected during operation depending upon the nature of the received signal or based upon one or more other operational parameters.

The resolution (and hence the number of bits) required by DAC 120 can be determined by considering the worst-case energy in the undesired channels, since quantization noise will be mixed by the undesired channels into the desired band at the output of the mixer. A terrestrial television receiver may need to tune a relatively weak desired channel when the receiver is close to the transmitter of a relatively strong undesired channel. For example assume the desired channel has a signal strength of −83 dBm (where dBm represents a decibel power level with reference to a power level of 1 milliwatt dissipated across a 75 ohm load), an undesired channel has a signal strength of −15 dBm, and the minimum signal to noise ratio (SNR) required at the output of the mixer is 15 dB. The integrated quantization noise for the LO signal in a 6 MHz band for a 10-bit DAC clocked at 2 gigahertz (2 GHz) is −84 dBc (decibel level with respect to carrier frequency $f_{LO}$). This quantization noise appears in every 6 MHz band from DC to $f_{CLOCK}/2$ (1 GHz) and is mixed by the −15 dBm undesired channel into the desired channel's band at a −99 dBm level (−15 dBm+(−84 dBc)). The resulting SNR is thus −83 dBm− (−99 dBm)=16 dB, which is greater than the minimum required SNR of 15 dB. Thus a 10-bit DAC yields barely acceptable results while a 9-bit DAC would not.

The switching speed of the DAC, which determines the maximum $f_{LO}$ which can be created because the clock of the DAC must be greater than twice the maximum $f_{LO}$, is determined by the on resistance of transistors 162, 164, 166, and 168 in FIG. 4B and the parasitic capacitances at the sources of the switches. There is a practical speed limit for this structure in a given technology because as the switch resistance is decreased the parasitic capacitance increases. However the practical speed limit is in the range of several GHz for existing integrated circuit technologies, which makes the DDFS/ mixer combination suitable for a broad variety of radio frequency receiver applications.

Interface circuit 170 converts the N-bit LO signal into pairs of true and complementary bits so that converter cell 160 can switch the currents differentially. In one embodiment, each of the D and DB signals as well as the current and converter cells are binarily weighted; thus the most significant bit pairs switch currents that are twice the currents switched by the second most significant bit pairs, the second most significant bit pairs switch currents that are twice the currents switched by the third most significant bit pairs, and so on. In this case interface circuit 170 provides 2N output signals consisting of N pairs of D and DB signals.

Preferably to achieve better performance, however, the less significant bits are binarily weighted as just described while the more significant bits are thermometer encoded. In a thermometer encoding scheme, the binary values will be switched using a corresponding number of equally-weighted currents. Thus M thermometer encoded bits switch 2M−1 equally-weighted current cells. The number of most significant bits that are thermometer encoded will vary depending on the desired performance, and the number of output pairs generated by interface circuit 170 will also vary accordingly.

The output signal is also preferably a differential signal formed between $I_{OUT+}$ and $I_{OUT-}$. In an alternative embodiment, however, if the drains of transistors 166 and 168 were connected to a reference voltage terminal, such as an analog ground terminal, the drains of transistors 162 and 164 would form a single-ended output signal.

It is noted that the embodiment for a tuner 100 as depicted in FIGS. 4A and 4B is believed to be particularly suited for a television tuner application. Such a television tuner application is described with respect to FIG. 5 below. It is further noted, however, that this embodiment may be utilized in other architectures and implementations, if desired.

Looking now to FIGS. 6A and 6B, an alternative embodiment for the tuner 100 is depicted. These embodiments include an additional sampling clock ($f_{CLK}$) and the use of modulator circuitry to process the digital LO signal 306.

FIG. 6A is a block diagram of an alternative embodiment for the tuner 100, according to the present invention. Instead of the variable oscillator and mixer of FIG. 1 (prior art), the embodiment of FIG. 6A includes a clock circuit (CLK) 650, a divider (÷X) 654, a direct digital frequency synthesizer (DDFS) 130, and a mixer circuit 105. The mixer circuit 105 includes a transconductor block 110 and a current multiplying DAC 620. As described with respect to FIG. 6B, the current multiplying DAC 620 of mixer circuit 105 can be implemented such that it utilizes a sampling clock ($f_{CLK}$) 652, which may be a clock signal that comes directly from the clock circuit (CLK) 650 or from some other source. In one implementation, the clock circuit (CLK) 650 can receive a reference frequency from a fixed oscillator, such as an external crystal oscillator, and can provide a fixed digital clock signal as an output. The mixer circuit 105 may also utilize the N-bit digital LO signal 306 from the DDFS 130. The IF output signal 304 of the tuner 100 is an analog signal that results from mixing the analog RF input signal 302 with the digital LO signal 306. As discussed above, the IF output signal 304 can be at any desired output frequency, including low-IF or zero-If output signals. Also as discussed above, the DESIRED CHANNEL input signal to the DDFS 130 controls the digital N-bit LO signal 306, and the output 656 of the transconductance amplifier block 110 can be a plurality of output signals that are each matched with one-bit of the incoming digital LO signal 306 to produce the IF output signal 304.

The DDFS 130 must typically be clocked at a frequency greater than twice the LO frequency range to satisfy the Nyquist criteria. This implies that the DDFS 130 must be clocked at greater than 2-times the frequency range of interest (e.g., 2×(107.9-88.1 MHz) for FM radio signals). The DAC 620 will typically be clocked at an even higher rate. The DDFS 130 will generate a signal, which will get used by the DAC 620 to mix the RF signal to IF. The DDFS 130 generates these signals in discrete steps, where the step size is equal to the channel spacing in the broadcast spectrum (e.g., 200 KHz for FM broadcasts in the US). It is noted that the actual frequencies created by the DDFS can be arbitrary because the signals can be mixed up to the desired output frequency (e.g., FM broadcast spectrum frequency) in the DAC 620. And these DDFS frequencies can be chosen near DC to minimize power dissipation within the DDFS 130. It is also noted that for FM broadcasts where a fixed reference oscillator is used, the reference oscillator could provide a reference signal between about 10-20 MHz, and the output clock signal ($f_{CLK}$) 652 of the clock circuit (CLK) 650 could be a digital clock signal at about 220 MHz.

FIG. 6B is a more detailed block diagram for the mixer circuit 105, according to the present invention. The analog RF input signal 302 is received by a transconductance amplifier 110, which is implemented as a plurality of transconductance gain blocks. The output of the transconductance amplifier 110 is a plurality (M) of signals 656 that are provided to a switching network 602. The switching network 602 is part of the mixing DAC 620, and the switching network 602 produces the IF output signal 304. For this embodiment, the mixing DAC 620 also includes an interpolation filter 606, a mixer 608, and a modulator 610. The digital N-bit LO signal 306 is first received by the interpolation filter 606 and then applied to mixer 608. This output is provided to modulator 610, which can be a delta-sigma modulator, and modulator 610 outputs a modulated M-bit digital signal 604. The switching network 602 mixes the M different output signals 656 from the transconductance amplifier 110 and the modulated M-bit digital signal 604 to generate the analog IF output signal 304.

In operation for the embodiment depicted in FIG. 6B, the input to the interpolation filter 606 comes into the DAC 620 at a rate of $f_{CLK}/X$. The interpolation filter interpolates (i.e., increases the sample rate) by X and filters images of the input signal. It is noted that the interpolation and filtering may be done in multiple stages for a more efficient implementation. The mixer 608 mixes the interpolated and filtered spectrum up to the desired broadcast spectrum (e.g., the FM broadcast spectrum). The modulator converts the digital N-bit LO signal into an M-bit digital word where M is less than N. Although quantization noise is added in the process, the modulator 610 can be designed to minimize the quantization noise in the frequency band of the broadcast spectrum (e.g., 88.1-107.9 MHz for FM broadcasts within the US).

It is noted that the total quantization noise is increased as M gets smaller while the quantization noise must reside from DC to $f_{CLK}/2$. Lowering the quantization noise within the broadcast band of interest increases the noise outside that band. The in-band noise must meet a minimum requirement based upon an undesired channel signal mixing the quantization noise into the desired output IF frequency. For example, the LO signal 604 at the output of the modulator 610 contains signal and quantization noise. The LO signal 604 will mix the desired channel to the desired IF. An undesired channel Δf away from the desired channel will mix quantization noise Δf away from the LO into the desired IF frequency. In a situation where the undesired channel is much stronger than the desired channel, the quantization noise will need to be much lower than the LO signal in order to obtain the needed signal to noise ratio out of the receiver. Energy outside of the broadcast band is preferably attenuated by the frequency response of the RF input amplifier. Therefore, quantization noise that is outside of the broadcast band is allowed to rise to some extent. The order of the modulator 610, the coefficients of the modulator 610 and the number of bits the modulator 610 quantizes is chosen to get the appropriate signal to noise output. The digital M-bit signal 604 out of the modulator 610 feeds into the switching network 602. And the signal 604 can be an M-bit binary weighted output. The current output of the switching network 602 is the multiplication of the analog RF input signal and the digitally generated LO signal and, therefore, contains the IF output.

In one implementation, there can be M binary weighted transconductors that make up the transconductor block 110. These transconductors can convert the RF input voltage into M binary weighted currents. The currents are weighted, if desired, to match the bit weighting of the digital M-bit signal 604 from the modulator 610. The switches of the switching network 602 can then be matched up such that bit M of the LO signal 604 switches in or out transconductor M; bit M-1 of the LO signal 604 switches in or out transconductor M-1, etc. In another implementation, the M-bit LO signal 604 can be converted into a thermometer code of $2^M-1$ bits and correspondingly there are $2^M-1$ equivalent transconductors for transconductor 110. Still further, a portion of the M-bit LO signal 604 and the transconductors can both be converted to thermometer coding. In another implementation the thermometer coded transconductors for transconductor 110 can be scrambled with respect to the thermometer coded LO bits 604. By using scrambling, the transconductors that could show up as non-linearities could be made to appear as random noise.

Figure 1:
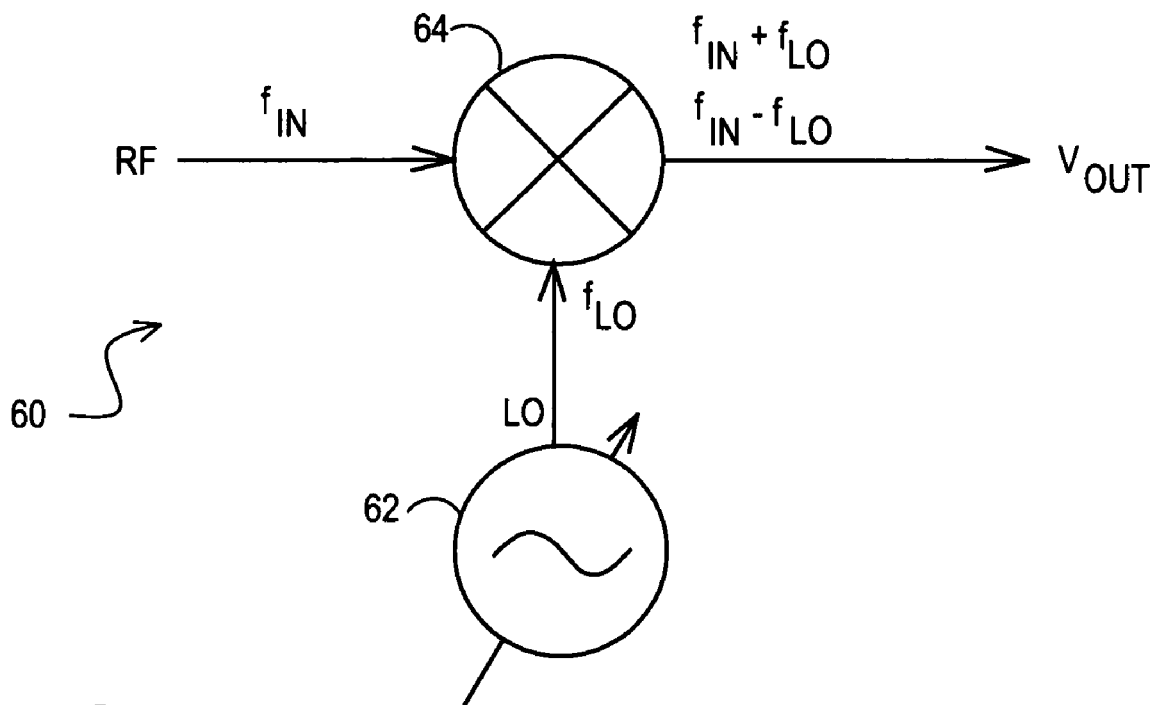
FIG. 1 (Prior Art) illustrates in schematic form a local oscillator and mixer circuit known in the prior art.
Figure 2:
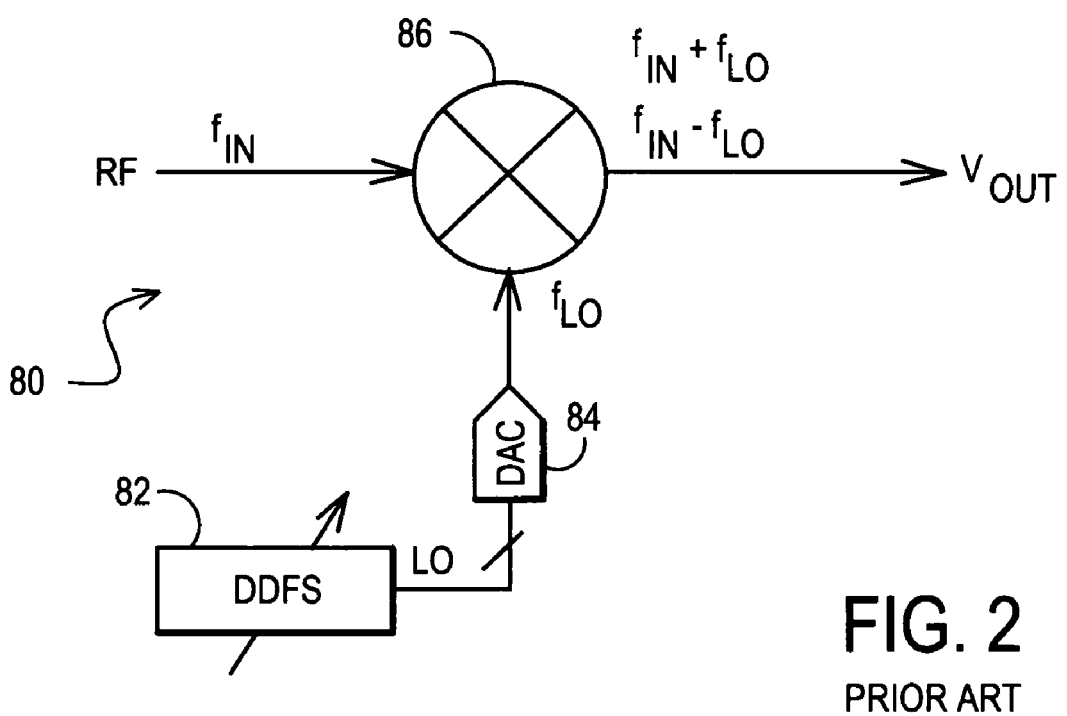
FIG. 2 (Prior Art) illustrates in partial block diagram and partial schematic form another local oscillator and mixer circuit known in the prior art.

The architecture of the present invention provides a number of advantages. For example, using the tuner of the present invention, the requirements of oscillator phase noise and spur performance are relaxed. Oscillator phase noise requirements in traditional architectures, such as FIGS. 1 and 2, are typically tight enough to require the use of LC-based oscillators. Unfortunately, LC oscillators are susceptible to magnetic and electric interference, which can create spurs (tones in the spectrum). In this implementation, the DAC 620 is clocked at a higher rate than the LO frequency. The phase noise requirements can be relaxed by the square root of the ratio between the highest LO frequency and the clock rate of the DAC 620. If this ratio is large enough, the specifications of the oscillator can be relaxed enough where alternate types of oscillators can be used. For example, one alternate type of oscillator is a ring oscillator that uses a plurality of odd number of cascaded inverters. Ring oscillators are typically more efficient than LC-based oscillators and less sensitive to coupling and interference.

Another advantage of the architecture of the present invention is that the reference oscillator can be fixed instead of programmable. LC oscillators often require a tuning range that corresponds to a variability of the LC product of up to 50%. The programmability and variability of the LC product adds area and noise as compared to the fixed frequency oscillator that can be utilized with the architecture of the present invention.

In addition, as shown in the examples below, direct conversion (IF is zero) is possible with the architecture of the present invention. In the conventional architectures of FIGS. 1 and 2, the choice of IF equal to zero is extremely difficult due to self mixing of the LO signal (i.e., the LO signal couples into the input creating the situation where the LO signal gets mixed with itself creating a large DC offset) or due to the LO signal radiating out of the antenna, reflecting off of an object and being received back by the antenna thereby creating an undesired variable component in the input RF signal. This architecture of the present invention solves this problem because the LO mixing signal never exists as a physical signal on any circuit node, but rather exists as a collection of digital bits. Because self-mixing is not an issue, using an IF equal to zero (direct conversion) is possible. Subsequent signal processing at an IF of zero can be more efficient than processing at a non-zero IF. Coupling of the clock oscillator to the input is not a difficult issue because the coupling appears as multiples of $f_{CLK}$ while the sin(x)/X response of the DAC 620 has nulls at multiples of $f_{CLK}$.

Another advantage of this architecture is that LO leakage is minimized. Just as there is no direct mechanism for the LO to couple to the RF path in the architecture of the present invention, there is no direct mechanism for the LO to radiate out through the input.

Linear mixing may also be utilized with the architecture of the present invention. In conventional mixers, the oscillator tends to have large non-linearities that manifest themselves as spurs in the frequency spectrum at multiples of the oscillator frequency. These non-linearities can mix energy in the RF spectrum to the IF frequency. The present invention allows for linear mixing where the non-linearities are much smaller than in the conventional architecture. In fact, the non-linearities can be made arbitrarily small through the use of scrambling or calibration.

It is noted that the embodiment for a tuner 100 as depicted in FIGS. 6A and 6B is believed to be particularly suited for a FM radio application. Such a FM radio application is described with respect to FIGS. 7A-C below. It is further noted, however, that this embodiment may be utilized in other architectures and implementations, if desired.

Television Implementation Example

The majority of television tuners used today are discrete single conversion tuners. Typical television tuners have inputs for receiving a radio frequency (RF) signals from an antenna or cable source having channels in the range of 48 megahertz (MHz) to 870 MHz. A tracking bandpass filter is often used to receive the RF INPUT signal and to attenuate undesired channel energy in order to provide a filtered signal to an input of a low noise amplifier (LNA). An RF synthesizer is often used to control a variable local oscillator (LO) provide a mixing signal in the range of 95 to 911 MHz. The mixing signal is combined with the output of the LNA in a mixer, which mixes the desired channel to an intermediate frequency (IF) of 44 MHz. The output of the mixer is then amplified in a programmable gain amplifier (PGA) and is filtered in an IF filter having a center frequency at the conventional IF of 44 MHz and having a passband of 6 MHz. Thus the IF filter provides an output signal containing the desired channel and having frequency content primarily from 41 MHz to 47 MHz.

Discrete single conversion tuners suffer several disadvantages. These Tuners require large amounts of circuit board space due to the large number of discrete components. They also require RF expertise to lay out the circuit board to avoid undesirable signal cross coupling and interference. Tracking bandpass filters often need manual calibration, increasing production cost. Also the performance of these tuners varies significantly over temperature.

It has long been thought that a silicon-based television tuner could be manufactured cheaper and with more stable performance than a discrete tuner and that silicon-based television tuners would ultimately replace discrete television tuners. Unfortunately, existing silicon-based television tuners do not perform as well as discrete tuners and have not become significant in the marketplace.

Existing silicon-based television tuners have used a so-called "up/down" or double conversion architecture. A tuner in such an architecture can include an LNA, an up conversion mixer, an RF synthesizer, a local oscillator, a surface acoustic wave (SAW) filter, a PGA, a down conversion mixer, a local oscillator, and an IF filter. The LNA typically has an input for receiving the RF input signal from an antenna or cable source. The up conversion mixer typically has a first input connected to the output of LNA and a second input for receiving a first LO mixing signal generated using the RF synthesizer and the oscillator. The SAW filter is typically external to the integrated circuit and has an input connected to the output of this up conversion mixer. The down conversion mixer will have a first input connected to the output of the external SAW filter, which has been passed through the PGA, and will have a second input for receiving a second LO mixing signal. The output of the down conversion mixer is often passed through an IF filter.

In operation of the double conversion receiver, the up conversion mixer receives a first mixing signal LO at a frequency chosen to mix the selected channel to a frequency band centered around 1100 MHz. The external SAW filter separates the desired channel, centered around 1100 MHz, from the unwanted channels. The down conversion mixer mixes the signals down to the desired IF frequency of 44 MHz using the second LO mixing signal at 1056 MHz.

While the up/down or double conversion architecture does not require manual calibration during manufacturing and is stable over temperature, it has many deficiencies that make its performance inferior to the discrete tuner. These tuners use two high frequency oscillators. Because they are high frequency it is possible to implement them in silicon using inductor-capacitor (LC) oscillators. However, LC-based oscillators have many drawbacks that reduce their desirability. First, they are susceptible to electric and magnetic interference, which can create spurs (or tones) and noise and lower overall performance. Second, two oscillators which are close in frequency tend to lock to one another. To avoid locking, there needs to be a lot of isolation between the two oscillators, which is difficult to achieve. Third, the first oscillator's range is nearly 100% of its frequency which means that the LC product must vary by about a 4:1 ratio to successfully tune over this range (since frequency is proportional to the square root of one over the LC product). However this range of values is difficult to achieve in silicon. Such an oscillator would usually be implemented as many selectable LC oscillators but this approach requires a lot of integrated circuit area. Fourth, having multiple LC oscillators adds phase noise that can degrade performance for digital television applications.

Another disadvantage relates to external SAW filter. The SAW filter is required because undesired channels need to be attenuated by a large amount and only SAW filters have the desired transfer characteristic at such high frequencies. However, SAW filters are expensive. They need to be driven with a matched impedance, which increases power dissipation substantially. SAW filters are lossy. Also while SAW filters have good attenuation they have poor frequency selectivity and pass more than just the desired channel.

Another disadvantage relates to the mixing process in different signal environments. Cable television tuning requirements are very different from terrestrial television tuning requirements because of the difference in energy levels between a desired channel and undesired channels at adjacent frequencies. A cable head-end drives all channels with similar power levels and therefore a cable television tuner receives the desired and undesired channels at similar power levels. A terrestrial television receiver could be much closer to undesired channels' transmitters than to the desired channel's transmitter, leading to the undesired channels having much more signal energy than the desired channel. The tracking filter of a discrete tuner helps filter the undesired channels. However, since there is no tracking filter in a double conversion architecture and since the SAW filter passes more than the desired channel, the mixers see the large energy difference between the desired and the undesired channel. And this energy difference is very problematic since any spur or noise in the oscillator or non-linearity in the mixing process can mix the large undesired channel or channels into the desired channel and destroy the reception of the desired channel. The result is that the double conversion tuner has sufficient performance for some cable television applications, in which signal strength of all channels is nearly uniform, but poor performance as a terrestrial television tuner.

FIG. 5 illustrates in partial block diagram and partial schematic form an integrated television tuner 200, according to the present invention, that advantageously uses the circuitry of FIGS. 4A and 4B to overcome problems with traditional solutions. Tuner 200 includes generally an LNA 202, a tracking bandpass filter 204, a DDFS labeled "DDFS1" 206, a DDFS labeled "DDFS2" 208, a mixer 220, a lowpass filter 226, a PGA 228, a mixer 230, a lowpass filter 236, a PGA 238, an up conversion mixer 240, a DAC 260, and an IF filter 262. LNA 202 has an input terminal for receiving an input signal labeled "RF INPUT", and an output terminal. Tracking bandpass filter 204 has an input terminal connected to the output terminal of LNA 202, a tuning input terminal for receiving the DESIRED CHANNEL signal, and an output terminal. DDFS 206 has an input for receiving the DESIRED CHANNEL signal, and output terminals for providing digital local oscillator signals labeled "LO1" and "LO1-90°". DDFS 208 has output terminals for providing digital local oscillator signals labeled "LO2" and "LO2-90°". It is noted that the tracking filter 204 may be eliminated, if desired. In addition, it is noted that an external variable gain amplifier could be utilized in front of LNA 202, if desired, and could provide operational advantages, for example, with respect to receiving terrestrial broadcasts. It is further noted that the second local oscillator 208 could be implemented as a fixed digital oscillator, if desired.

Mixer 220 has a first input terminal connected to the output terminal of tracking bandpass filter 204, a second input terminal for receiving signal LO1, and an output terminal for providing an in-phase baseband signal labeled "I". Mixer 220 includes a transconductance amplifier 222 and a DAC 224. Transconductance amplifier 222 has an input terminal connected to the output terminal of filter 204, and an output terminal. DAC 224 has a first input terminal connected to the output terminal of transconductance amplifier 222, a second input terminal for receiving signal LO1, and an output terminal for providing signal I. Filter 226 has an input terminal connected to the output terminal of mixer 220, and an output terminal. PGA 228 has an input terminal connected to the output terminal of filter 226, and an output terminal.

Mixer 230 has a first input terminal connected to the output terminal of tracking bandpass filter 204, a second input terminal for receiving signal LO1-90°, and an output terminal for providing a quadrature baseband signal labeled "Q". Mixer 230 includes a transconductance amplifier 232 and a DAC 234. Transconductance amplifier 232 has an input terminal connected to the output terminal of filter 204, and an output terminal. DAC 234 has a first input terminal connected to the output terminal of transconductance amplifier 232, a second input terminal for receiving signal LO1-90°, and an output terminal for providing signal Q. Filter 236 has an input terminal connected to the output terminal of mixer 230, and an output terminal. PGA 238 has an input terminal connected to the output terminal of filter 236, and an output terminal.

Up conversion mixer 240 includes an analog-to-digital converter (ADC) 242, a lowpass filter 244, a mixer 246, an ADC 248, a lowpass filter 250, a mixer 252, and a summing device 254. ADC 242 has an input terminal connected to the output terminal of PGA 228, and an output terminal. Lowpass filter 244 has an input terminal connected to the output terminal of ADC 242, and an output terminal. Mixer 246 has a first input terminal connected to the output terminal of lowpass filter 244, a second input terminal for receiving signal LO2, and an output terminal. ADC 248 has an input terminal connected to the output terminal of PGA 238, and an output terminal. Lowpass filter 250 has an input terminal connected to the output terminal of ADC 248, and an output terminal. Mixer 252 has a first input terminal connected to the output terminal of lowpass filter 250, a second input terminal for receiving signal LO2-90°, and an output terminal. Summing device 254 has a positive input terminal connected to the output terminal of mixer 246, a negative input terminal connected to the output terminal of mixer 252, and an output terminal. DAC 260 has an input terminal connected to the output terminal of summing device 254, and an output terminal. IF filter 262 has an input terminal connected to the output terminal of DAC 260, and an output terminal for providing an output signal of tuner 200 labeled "IF OUTPUT".

In operation tuner 200 illustrates one example of an RF receiver in which the circuitry described in FIGS. 4A and 4B may be advantageously used. The RF INPUT signal is received from an antenna or cable source (not shown) and is provided to the input terminal of LNA 202. LNA 202 has a variable gain. The output of LNA 202 is input to tracking bandpass filter 204 whose center frequency is tunable based on the DESIRED CHANNEL input signal to reject undesired channels.

The tuned output signal, which includes the desired channel plus attenuated undesired channels, is mixed to baseband as follows. The output of filter 204 is converted into a current signal by highly linear transconductance amplifier 222. The current signal is then mixed in DAC 224, which functions as a current multiplying DAC using LO1 as a mixing signal, to provide the in-phase baseband signal I. Likewise the output of filter 204 is converted into a current signal by a separate highly linear transconductance amplifier 232, and is mixed in DAC 234 using a phase-shifted version of LO1, namely LO1-90°, as a mixing signal to develop the quadrature baseband signal Q. DDFS 206, transconductance amplifiers 222 and 232, and DACs 224 and 234 are implemented as described above with reference to FIGS. 4A and 4B.

Depending on which channel is chosen as the DESIRED CHANNEL, DDFS 206 creates an appropriate sine wave to mix the desired channel down to baseband (i.e. DC). For example if the desired channel is centered at 500 MHz, DDFS 206 creates a 500 MHz sine wave for LO1 as well as a 90° shifted sine wave for LO1-90°. In an alternate embodiment LO1-270° could be used as the phase-shifted version of LO1 in which case the Q signal would be an inverted version of the Q signal as shown. Note that according to Nyquist's theorem DDFS 206 and current multiplying DACs 224 and 234 need to be clocked at greater than twice the highest frequency sine wave. Thus $F_{CLOCK} > 2*870 = 1.740$ GHz and is preferably 2 GHz. The operation of the various circuits at those speeds is possible using currently-available CMOS or bipolar-CMOS (BICMOS) integrated circuit manufacturing technology.

The outputs of mixers 220 and 230 include the desired channel information spectrum and all other energy is filtered by filters 226 and 236. These outputs are then further processed at baseband. Filters 226 and 236 are anti-alias lowpass filters having a cutoff frequency of about 3 MHz. The outputs of filters 226 and 236 are amplified by PGAs 228 and 238 in order to increase the amplitude of small signals and to minimize the dynamic range required of ADCs 242 and 248 in up conversion mixer 240.

In up-conversion mixer 240 the clock rate of ADCs 242 and 248 is preferably below the frequency of any received signal (i.e., 48 MHz) to minimize interference created from the switching that gets reflected back into the analog signal, but is also as high as possible to minimize the order of filters 226 and 236. For use in a television receiver having an IF center frequency of 44 MHz, a clock rate of 40 MHz was chosen. Lowpass filters 244 and 250 provide additional attenuation for undesired channels and are implemented in the digital domain. In an alternative embodiment, up conversion mixer 240 could be implemented in the analog domain and in that case ADCs 242 and 248 would not be necessary. DDFS 208 is preferably clocked at 100 MHz to satisfy the Nyquist criterion for generating a 44 MHz mixing signal.

Even though a baseband digital signal can be used by most televisions available today with simple modifications, tuner 200 preferably provides the analog IF OUTPUT at a standard IF of 44 MHz, although any other desirable IF such as 38 MHz may be used as well. Thus it is necessary for tuner 200 to re-combine the baseband I and Q signals to reconstruct the full 6 MHz spectrum in the IF signal. Up conversion mixer 240 converts the filtered, gain-adjusted I and Q signals into the digital domain using ADCs 242 and 246. Conversion of these signals into the digital domain avoids generating local oscillator signals that can creates spurs or tones, allows a relaxation of the specifications of analog filters 226 and 236, and makes it easier to extract audio signals. Up conversion mixer 240 mixes the outputs of ADCs 242 and 246 (the digital I and Q signals) to IF using digital local oscillator signals LO2 and LO2-90° before combining them in summing device 254. The output of summing device 254 is converted back to analog using IF DAC 260 and filtered in IF filter 262 for driving off-chip. In other embodiments which interface to televisions at baseband, up conversion mixer 240, DAC 260, and IF filter 262 may be omitted.

Tuner 200 uses the circuitry described in FIGS. 4A and 4B to implement an architecture that overcomes the problems associated with conventional tuners by not using oscillators to generate LO1 and LO2 and their phase-shifted variants. DDFS 206 provides an ultra pure sine wave with very low phase noise and low spur. The digitized sine wave is widely tunable and is easily generated. Since there is no circuit node that contains an actual oscillator signal, as there would be with a conventional LC oscillator, there is no mechanism for the local oscillator signals to leak or radiate into other circuits, causing unwanted locking or spurs. Another advantage of using DACs 224 and 234 is that they allow for direct down conversion to DC in the first mixer. Direct down conversion is not normally possible with an LC oscillator because leakage of the local oscillator signal to the RF INPUT causes a situation where the local oscillator mixes with itself and produces an enormous DC offset with respect to the desired signal. Generation and use of a digital local oscillator signal as required by DACs 224 and 234 eliminate this problem. The first digital local oscillator signal, LO1, mixes the center of the desired channel to DC in the current multiplying DAC by controlling the orientation of the switches. Thus tuner 200 is suitable for integration onto a single silicon chip.

It should be apparent that the local oscillator and mixer circuit described in FIGS. 4A and 4B can be used in a wide variety of RF receiver applications, including television, cellular telephones, pagers, global positioning system (GPS) receivers, cable modems, cordless phones, audio receivers, and the like. The transconductance amplifier and DAC may also use other transistor technologies besides CMOS. Also the type of encoding of the digital oscillator signal used within the DAC, such as binary weighted and thermometer encoded, may vary.

FM Radio Implementation Example

In the United States, FM audio signals are broadcast in 200 KHz channels in the frequency band from 88.1 MHz to 107.9 MHz. Europe, Japan and other countries have frequency plans similar to the United States. FM receivers for broadcast audio convert the signal received at the antenna into audio signals that drive a speaker. These FM receivers can typically be divided into a RF tuner section and an IF section. The typical RF tuner filters out undesired channels and amplifies the RF spectrum at the desired channel frequency. Also, within the RF tuner, a programmable or tunable local oscillator (LO) creates a signal which is an IF frequency away from the desired channel. The desired channel and LO signal are then multiplied together in the mixer which creates sum and difference frequency components thereby translating the desired channel from RF to IF. The typical IF section contains an IF filter which filters out channels near the desired channel (these channels are often not adequately filtered by the RF tuner). The IF section also typically contains an IF amplifier and a limiter to remove amplitude information, an FM modulator to convert the FM modulated IF signal to an audio signal, and an audio amplifier for driving a speaker.

Figure 7C:
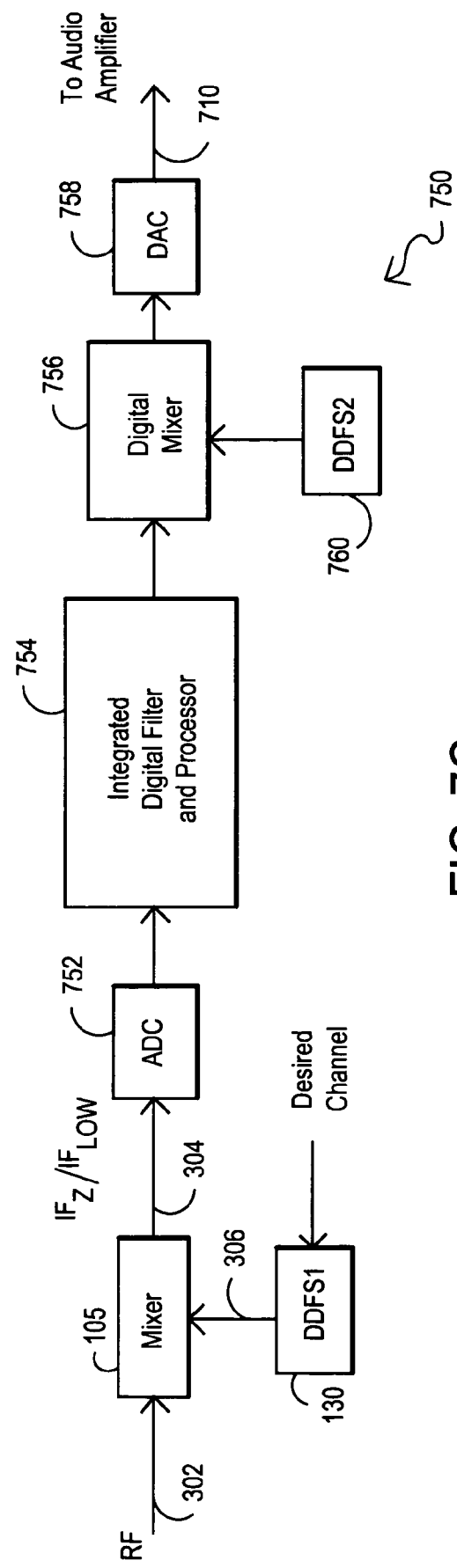
FIG. 7C is a block diagram for a low-IF or zero-IF integrated FM radio receiver implementation utilizing the tuner of the present invention and an integrated digital filter.

FIGS. 7A, 7B and 7C provide example FM radio implementations that advantageously utilize the circuitry of FIGS. 6A and 6B to provide efficient solutions. The tuner of the present invention includes a unique method for generating the LO mixing signal in using a direct digital frequency synthesizer and a fixed oscillator and includes a unique mixer circuit in using a mixing DAC to mix an analog RF input signal and a digital LO signal. More particularly, FIG. 7A provides an example embodiment where a standard IF (equal to about 10.7 MHz for FM radio) is utilized. FIG. 7B provides an example embodiment where a low-IF (equal to or below about three channel widths, and preferably equal to or below about one channel width) or zero-IF is utilized along with an analog filter. And FIG. 7C provides an example embodiment where a low-IF (equal to or below about three channel widths, and preferably equal to or below about one channel width) or zero-IF is utilized along with an analog-to-digital converter and digital filtering. It is noted that for FM broadcasts within the United States the channel widths are about 200 KHz. Thus, for the purposes of this description a low-IF would be an IF frequency equal to or below about 600 KHz and preferably equal to or below about 200 KHz.

FIG. 7A is a block diagram for an integrated FM radio receiver implementation 700 that utilizes a mixer circuit 105, a DDFS 130 and an external filter 702. The RF input signal 302 and the digital LO signal 306 from the DDFS 130 (which is controlled in part by the DESIRED CHANNEL signal) is received by the mixer circuit 105. The IF output signal 304 is at a desired IF frequency ($IF_{FM}$) and can be filtered by a filter 702, such as an external SAW filter. The signal can then be passed through an IF amplifier, such as low noise amplifier (LNA) 704, and a limiter 706. Finally, the signal is passed through an FM demodulator 708 to produce an analog output signal 710 that can be applied to an audio amplifier and speakers.

One advantage of the FM architectures utilizing a tuner 100 of the present invention is the IF filter utilized in traditional architectures can be removed. In conventional FM tuners, the output IF (typically 10.7 MHz) is fed into an external ceramic or SAW filter to remove adjacent channel signals prior to FM demodulation. This filter can be expensive. Because the present invention allows direct conversion (IF=zero) or low-If conversion (IF near zero) architectures, it is possible to remove the adjacent channel signals with high order analog or digital filters. The desired channel can then be mixed up in the analog or digital domain to the standard IF. FIGS. 7B and 7C provide example embodiments for such a low IF or zero IF architecture.

FIG. 7B is a block diagram for a low-IF or zero-IF integrated FM radio receiver implementation 720 that utilizes a mixer circuit 105, DDFS 130 and an integrated analog filter 722. The RF input signal 302 and the digital LO signal 306 from the DDFS 130 (which is controlled in part by the DESIRED CHANNEL signal) is received by the mixer circuit 105. The IF output signal 304 is at a desired zero-IF or low-IF frequency ($IF_{LOW}/IF_Z$) and can be filtered by a filter 722, such as an integrated analog filter. The signal can then by passed through an IF amplifier, such as low noise amplifier (LNA) 724. Next, mixer 726 and mixing signal 728 can be used to mix up the signal to a desired IF frequency ($IF_{FM}$) expected by the FM demodulator 708. Finally, the signal is passed through an FM demodulator 708 to produce an analog output signal 710 that can be applied to an audio amplifier and speakers.

FIG. 7C is a block diagram for a low-IF or zero-IF integrated FM radio receiver implementation 750 that utilizes a mixer circuit 105, a DDFS1 130 and an integrated digital filter 756. The RF input signal 302 and the digital LO signal 306 from a first DDFS1 130 (which is controlled in part by the DESIRED CHANNEL signal) is received by the mixer circuit 105. The IF output signal 304 is at a desired zero-IF or low-IF frequency ($IF_{LOW}/IF_Z$) and can be converted to a digital signal by analog-to-digital converter (ADC) 752. An integrated digital filter and processor 754 can then be used to filter the digital signal and demodulate the signal information. Next, digital mixer 756 and a mixing signal from a second DDFS2 760 can be used to digitally mix up the signal, and a digital-to-analog converter (DAC) 758 can be used to produce an analog output signal 710 that can be applied to an audio amplifier and speakers. It is further noted that the second local oscillator 760 could be implemented as a fixed digital oscillator, if desired.

Multiple Tuner Implementation Examples

Figure 8A:
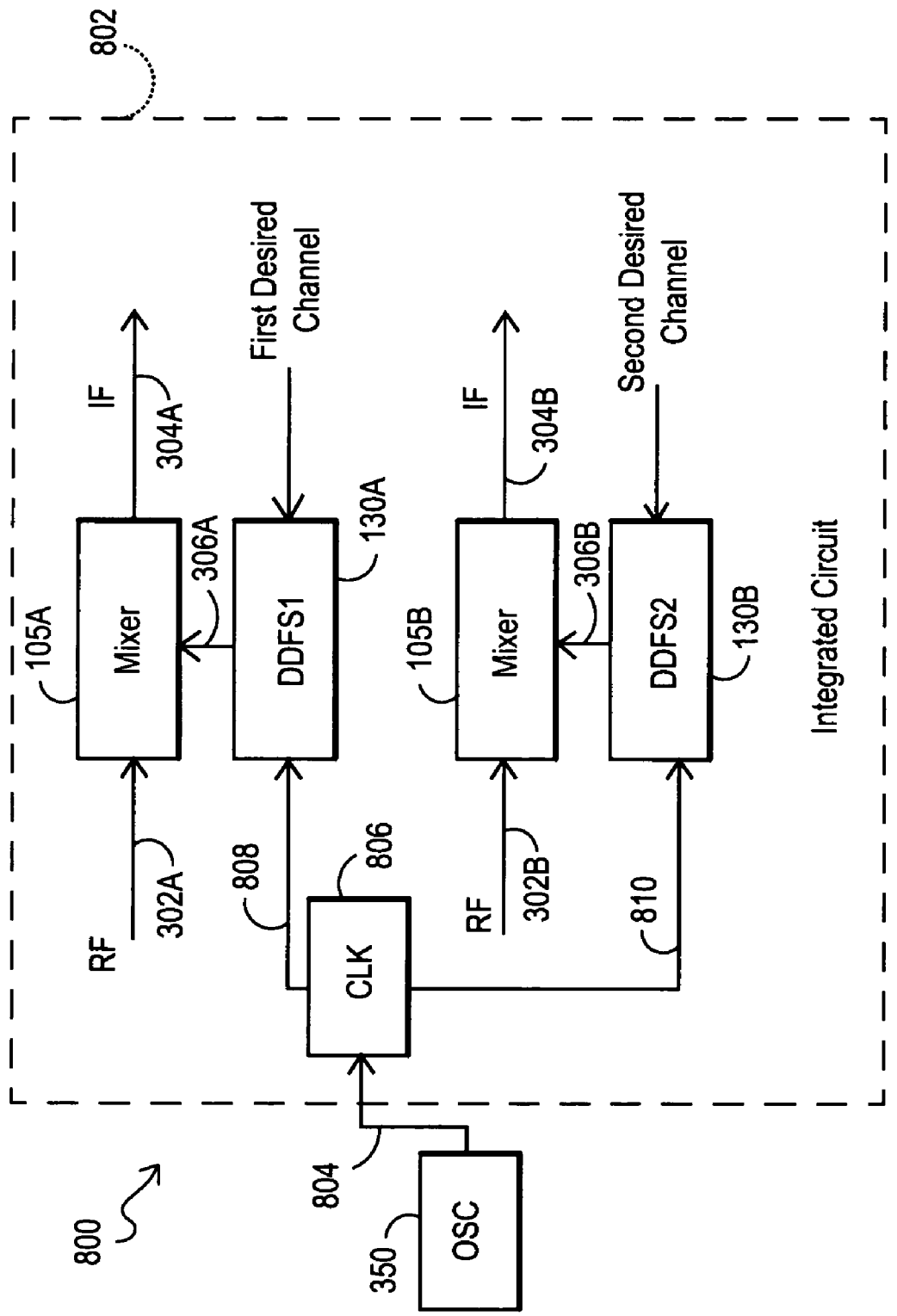
FIG. 8A is a block diagram for a multi-tuner integrated circuit that includes multiple receivers that utilize a tuner according to the present invention.
Figure 8B:
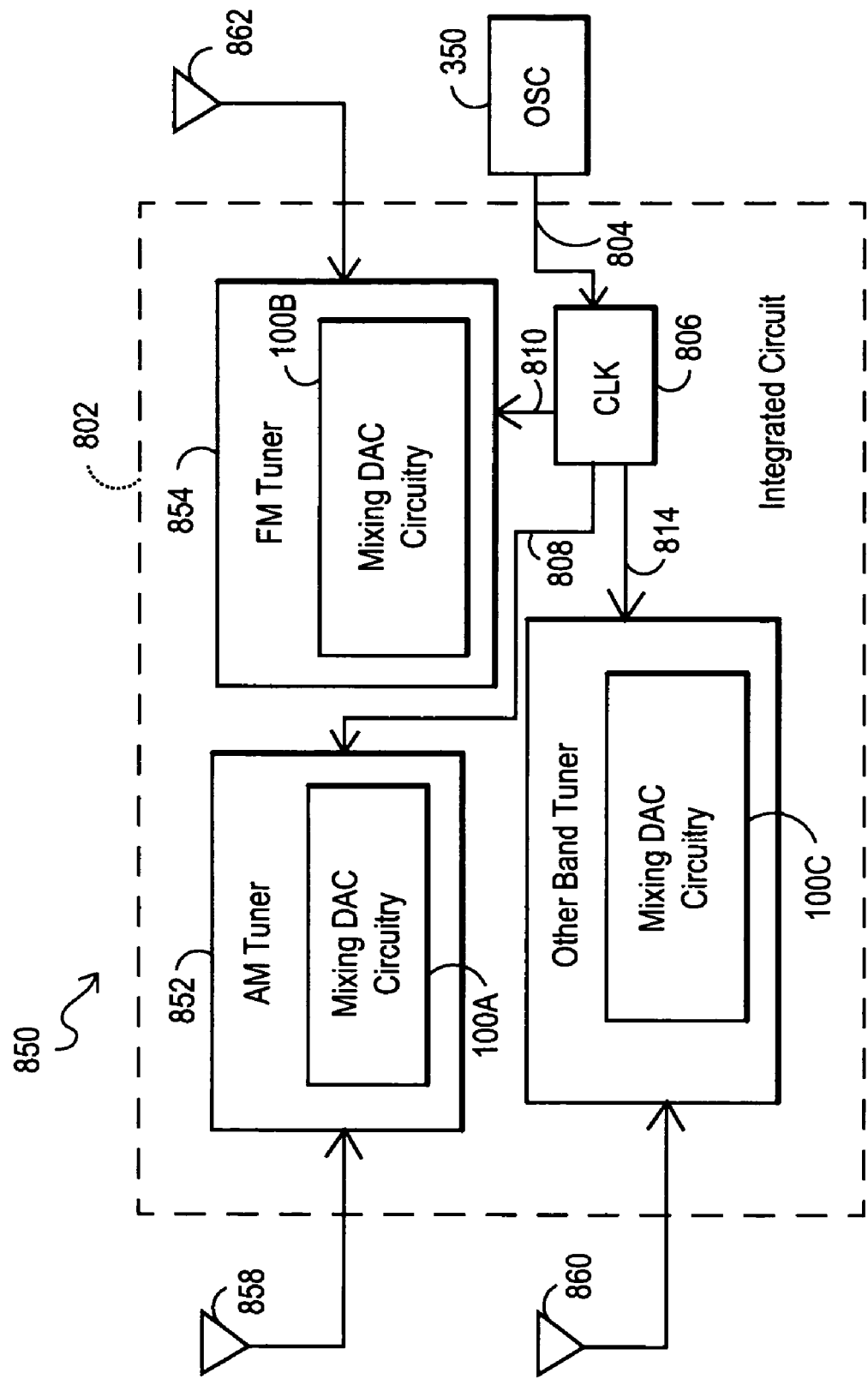
FIG. 8B is a block diagram for an integrated circuit that includes tuners for multiple radio bands, and each of these tuners utilizes a tuner according to the present invention.

The tuner 100 of the present invention also allows multiple tuners to be implemented on the same integrated circuit. In conventional tuners, reception of multiple radio frequency bands (e.g., AM, FM, weather) requires multiple oscillators. Utilizing the present invention, only a single oscillator is required to receive multiple radio frequency bands because all LO frequencies can be digitally generated. Also, for conventional tuners it is extremely difficult to put two tuners that receive the same band on the same die and have them simultaneously tune to channels that are near to each other. This difficulty is due to the tendency for two oscillators to lock to one another (i.e., oscillate at the same frequency) if there is inadequate isolation between them. The architecture of the present invention does not suffer from this problem because the digital LOs for each tuner are generated from the same oscillator. The use of digital LO signals and mixing DACs, therefore, allows multiple tuners to be included on the same integrated circuit without causing interference problems caused by different analog LO frequencies that would exist if multiple tuners were included on a single integrated circuit using the prior art architectures of FIGS. 1 and 2. FIGS. 8A and 8B provide example embodiments for dual tuner implementations.

FIG. 8A is a block diagram for an implementation 800 including a multi-tuner integrated circuit 802 that utilizes multiple tuners of the present invention. The integrated circuit 802 includes two or more receive paths. In the embodiment depicted, two receive paths are shown. In the first receiver, an RF input signal 302A and a digital LO signal 306A from a first DDFS1 130A (which is controlled by a FIRST DESIRED CHANNEL signal) are received by mixer 150A to produce a first IF output signal 304A. In the second receiver, an RF input signal 302B and a digital LO signal 306B from a second DDFS2 130B (which is controlled by a SECOND DESIRED CHANNEL signal) are received by mixer 150B to produce a second IF output signal 304B. If desired, both digital synthesizers 130A and 130B can receive a first digital clock signal 808 and a second digital clock signal 810, respectively, from the clock control circuit (CLK) 806. And the clock control circuit (CLK) 806 can use a reference signal 804 from an external oscillator (OSC) 350 to generate the digital clock signals 808 and 810. It is also noted that the RF input signals 302A and 302B can share the same input signal path, that the digital clock signals 808 and 810 could be the same or different, and that the oscillator 350 could be on-chip, if desired. It is further noted that other variations and configurations could also be implemented and, therefore, that the embodiment depicted in FIG. 8A is to provided merely as an example.

FIG. 8B is a block diagram for an embodiment 850 including an integrated circuit 802 that includes tuners for multiple radio bands, and each of these tuners utilize the tuner circuitry of the present invention. For example, integrated circuit 802 includes an AM tuner 852, FM tuner 854, and any other desired radio band as represented by tuner 856. As shown, the AM tuner 852 receives an RF input signal from antenna 858 and utilizes in part tuner 10A, according to the present invention, to generate tuned AM signals. The FM tuner 854 receives an RF input signal from antenna 862 and utilizes in part tuner 100B, according to the present invention, to generate tuned FM signals. And the other band tuner 856 receives an RF input signal from antenna 860 and utilizes in part tuner 100C, according to the present invention, to generate tuned signals in the other desired band. The different tuners 852, 854 and 856 can also use digital clock signals 808, 810 and 814 from a clock control circuit (CLK) 806 to generate their respective LO signals. As with FIG. 8A, the clock control circuit (CLK) 806 can utilize the fixed oscillator 350 in generating the digital clock signals for the on-chip tuners. Is noted that the tuners 852, 854 and 856 could use the same antenna, if desired. And it is further noted that the oscillator 350 could be on-chip and that the digital clock signal 808, 810 and 814 may be the same or different, as desired. It is further noted that other variations and configurations could also be implemented and, therefore, that the embodiment depicted in FIG. 8B is to provided merely as an example.

With respect to FIGS. 8A and 8B, it is noted that these tuners can be implemented to tune any desired RF signal. For example, multiple TV tuners or multiple FM tuners may be included on the same integrated circuit. In addition, a TV tuner and an FM tuner could be included on the same integrated circuit. Other combinations could be implemented as well utilizing the tuner architecture of the present invention.

Further modifications and alternative embodiments of this invention will be apparent to those skilled in the art in view of this description. It will be recognized, therefore, that the present invention is not limited by these example arrangements. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the implementations and architectures. For example, equivalent elements may be substituted for those illustrated and described herein, and certain features of the invention may be utilized independently of the use of other features, all as would be apparent to one skilled in the art after having the benefit of this description of the invention.

What is claimed is:

1. A tuner comprising:
   a direct digital frequency synthesizer having an output terminal for providing a digital local oscillator signal having a frequency chosen to mix a channel to a desired frequency; and
   a mixer having a first input terminal for receiving an analog radio frequency signal, a second input terminal coupled to the output terminal of the direct digital frequency synthesizer for receiving the digital local oscillator signal, and an output terminal for providing an analog output signal at a desired frequency said mixer mixing the analog radio frequency signal with the digital local oscillator signal for providing the analog output signal.

2. The tuner of claim 1, wherein the desired frequency of the output signal is at baseband.

3. The tuner of claim 1, wherein the radio frequency signal comprises a plurality of channels and wherein the desired frequency of the output signal is less than or equal to three channel widths.

4. The tuner of claim 1, wherein the radio frequency signal comprises a plurality of channels and wherein the desired frequency of the output signal is greater than three channel widths.

5. The tuner of claim 4, wherein the radio frequency signal represents a radio band signal.

6. The tuner of claim 5, wherein the radio band signal is an FM radio signal.

7. The tuner of claim 1, wherein the direct digital frequency synthesizer and the mixer are combined in a single integrated circuit.

8. The tuner of claim 7, further comprising at least one additional receive path on the single integrated circuit, the additional receive path comprising:
   a second direct digital frequency synthesizer having an output terminal for providing a digital local oscillator signal having a frequency chosen to mix a channel to a desired frequency; and a second mixer having a first input terminal for receiving a radio frequency signal, a second input terminal coupled to the output terminal of the second direct digital frequency synthesizer, and an output terminal for providing a second output signal at a desired frequency.

9. The tuner of claim 8, wherein the first mixer and the second mixer receive a radio frequency signal within the same frequency band.

10. The tuner of claim 8, wherein the first mixer and the second mixer receive a radio frequency signal in different frequency bands.

11. The tuner of claim 7, wherein the radio frequency signal represents a television signal.

12. The tuner of claim 11, further comprising a second mixer having a first input terminal for receiving the radio frequency signal, a second input terminal, and an output terminal for providing a quadrature signal, wherein the direct digital frequency synthesizer further has a second output terminal coupled to the second input terminal of the second mixer for providing for providing a phase-shifted digital local oscillator signal.

13. The tuner of claim 12, further comprising a converter circuit configured to convert the output signals from the first and second mixers to a predetermined center frequency.

14. The tuner of claim 13, further comprising a second direct digital frequency synthesizer having an output coupled to the converter circuit.

15. The tuner of claim 7, further comprising an oscillator having a clock signal as an output, the mixer being configured to receive the clock signal and the direct digital frequency synthesizer being configured to receive the clock signal through a divider.

16. The tuner of claim 15, wherein the mixer further comprises an interpolation filter and a modulator coupled to the output of the direct digital frequency synthesizer to generate a digital M-bit signal to a switching network and the mixer further comprises transconductance circuitry configured to output M current signals to the switching network, the switching network being configured to output the output signal at the desired frequency.

17. The tuner of claim 7, wherein the radio frequency signal represents a radio band signal.

18. The tuner of claim 17, wherein the radio band signal is an FM radio signal.

19. The tuner of claim 1, wherein the mixer comprises:
a transconductance amplifier having an input terminal for receiving the radio frequency signal, and an output terminal for providing at least one current signal; and
a mixing digital-to-analog converter having a first input terminal coupled to the output terminal of the transconductance amplifier, a second input terminal coupled to the output terminal of the direct digital frequency synthesizer, and an output terminal for providing the output signal at the desired frequency.

20. The tuner of claim 19, wherein the radio frequency signal, the current signal, and the output signal comprise differential signals.

21. The tuner of claim 19, wherein the transconductance amplifier comprises a plurality of current cells.

22. The tuner of claim 21, wherein each cell comprises: a current source having first and second terminals, the current source having a size proportional to an order of the cell and generating an output current proportional to a voltage applied at the second terminal; a modulation circuit configured to modulate a voltage at the first terminal of the current source in response to a received voltage signal; and a selection circuit configured to selectively divert the output current between the first output terminal and a second output terminal in response to a bit of a digital local oscillator signal having an order corresponding to an order of the cell.

23. The tuner of claim 22, wherein the first output terminal comprises a single-ended output signal and the second output terminal comprises a reference voltage terminal.

24. The tuner of claim 22, wherein the first and second output terminals together form a differential output signal of the mixer.

25. The tuner of claim 22, further comprising:
a second current source having first and second terminals, the second current source having a size proportional to the order of the cell and generating an output current proportional to a voltage applied at the second terminal;
means for modulating a voltage at the first terminal of the second current source in response to a second received voltage signal; and
means for selectively diverting current between the second output terminal and the first output terminal respectively in response to the bit and a complement of the bit.

26. The tuner of claim 21, wherein the plurality of current cells is characterized as being binarily weighted.

27. The tuner of claim 21, wherein the plurality of current cells include a first plurality of current cells characterized as being binarily weighted and a second plurality of current cells characterized as being equally weighted.

28. The tuner of claim 1, wherein the direct digital frequency synthesizer further comprises an input terminal for receiving a tuning signal corresponding to a desired channel and is configured to provide the digital local oscillator signal at a frequency determined at least in part by the tuning signal.

29. A method for tuning a signal comprising the steps of:
generating a digital local oscillator signal using a direct digital frequency synthesizer having a frequency chosen to mix a channel to a desired frequency;
receiving an analog radio frequency signal; and
mixing the analog radio frequency signal with the digital local oscillator signal to provide an analog output signal at the desired frequency.

30. The method of claim 29, wherein the desired frequency of the output signal is at baseband.

31. The method of claim 29, wherein the analog radio frequency signal comprises a plurality of channels and wherein the desired frequency of the output signal is less than or equal to three channel widths.

32. The method of claim 29, wherein the analog radio frequency signal comprises a plurality of channels and wherein the desired frequency of the output signal is greater than three channel widths.

33. The method of claim 29, wherein the generating and mixing steps are performed within a single integrated circuit.

34. The method of claim 33, further comprising generating a second digital local oscillator signal having a frequency chosen to mix a channel to a desired frequency, and mixing the analog radio frequency signal with the second digital local oscillator signal to provide a second output signal at the desired frequency, wherein the additional generating and mixing steps are also performed within the single integrated circuit.

35. The method of claim 34, wherein the first mixer and the second mixer receive a radio frequency signal within the same frequency band.

36. The method of claim 34, wherein the first mixer and the second mixer receive a radio frequency signal in different frequency bands.

37. The method of claim 33, wherein the radio frequency signal represents a television signal.

38. The method of claim 37, wherein the desired frequency of the output signal is at baseband and further comprising converting the output signal from baseband to a predetermined center frequency utilizing a second digital local oscillator signal.

39. The method of claim 33, further comprising providing a reference clock signal and utilizing the reference clock signal in the generating and mixing steps.

40. The method of claim 39, wherein the mixing step comprises converting the radio frequency signal to M current signals, generating an M-bit digital signal from the digital local oscillator signal, and mixing the M current signals with the M-bit digital signal to provide the output signal at the desired frequency.

41. The method of claim 33, wherein the radio frequency signal represents a radio band signal.

42. The method of claim 41, wherein the radio band signal is an FM radio signal.

43. The method of claim 29, wherein the mixing step comprises:
converting the analog radio frequency signal to at least one current signal; and mixing the at least one current signal with the output from the direct digital frequency synthesizer.

44. The method of claim 43, wherein the analog radio frequency signal, the current signal, and the output signal comprise differential signals.

45. The method of claim 43, wherein the converting step comprises generating a plurality of current signals using a plurality of transconductor cells.

46. The method of claim 29, further comprising applying to the direct digital frequency synthesizer a tuning signal corresponding to a desired channel to be tuned.

* * * * *